(12) United States Patent
Watanabe

(10) Patent No.: US 9,117,832 B2
(45) Date of Patent: Aug. 25, 2015

(54) SEMICONDUCTOR DEVICE WITH PHYSICAL MANIPULATION DETECTOR AND CORRECTOR

(75) Inventor: Hiroshi Watanabe, Hsinchu (TW)

(73) Assignee: PHISON ELECTRONICS CORP., Miaoli (TW)

(*) Notice: Subject to any disclaimer, the term of this patent is extended or adjusted under 35 U.S.C. 154(b) by 669 days.

(21) Appl. No.: 13/488,459

(22) Filed: Jun. 5, 2012

(65) Prior Publication Data

US 2013/0325372 A1 Dec. 5, 2013

(51) Int. Cl.
*H01L 27/115* (2006.01)
*H01L 23/58* (2006.01)
*H01L 23/00* (2006.01)

(52) U.S. Cl.
CPC ......... *H01L 23/576* (2013.01); *H01L 27/11558* (2013.01)

(58) Field of Classification Search
CPC ............ H01L 29/788; H01L 27/11558; H01L 23/576
See application file for complete search history.

(56) References Cited

U.S. PATENT DOCUMENTS

| 7,075,284 | B2* | 7/2006 | Watanabe et al. ......... 324/76.11 |
| 7,224,157 | B2 | 5/2007 | Watanabe et al. |
| 7,266,034 | B2* | 9/2007 | Hirai et al. ................. 365/222 |
| 7,652,317 | B2 | 1/2010 | Watanabe |
| 2008/0079057 | A1 | 4/2008 | Hagishima et al. |
| 2009/0218613 | A1 | 9/2009 | Watanabe |
| 2013/0003466 | A1* | 1/2013 | Shirota et al. ............ 365/185.29 |

FOREIGN PATENT DOCUMENTS

| JP | 3959340 | 5/2007 |
| TW | 201301349 | 1/2013 |

OTHER PUBLICATIONS

Watanabe et al., "Integrated Batteryless Electron Timer", IEEE Transactions on Electron Devices 58 (3), Mar. 2011, pp. 792-797.
Watanabe et al., "Scaling Effects on Gate Leakage Current", IEEE Transactions on Electron Devices 50 (8), Aug. 2003, pp. 1779-1784.
Watanabe et al., "Determination of Tunnel Mass and Physical Thickness of Gate Oxide Including poly-Si/SiO2 and Si/SiO2 Interfacial Transition Layers", IEEE Transactions on Electron Devices 53 (6), Jun. 2006, pp. 1323-1330.

* cited by examiner

*Primary Examiner* — Allison P Bernstein
(74) *Attorney, Agent, or Firm* — Jianq Chyun IP Office

(57) ABSTRACT

A semiconductor device includes a first SSAD unit and a second SSAD unit. The first SSAD unit has at least one first transistor with a first dielectric layer between a first substrate and a first floating gate. The second SSAD unit has at least one second transistor with a second dielectric layer between a second substrate and a second floating gate. The second dielectric layer is thicker than the first dielectric layer.

19 Claims, 23 Drawing Sheets

SEMICONDUCTOR DEVICE WITH PHYSICAL MANIPULATION DETECTOR AND CORRECTOR

BACKGROUND

1. Field of the Invention

The present invention relates to a semiconductor device, used for aging device, and more particularly to a semiconductor device applied in a Solid-State Aging Devices (SSAD), and an operation method and an application circuit thereof.

2. Description of Related Art

An electronic timer being free from a battery has been expected in various applications. Usually, the SSAD unit that includes a circuit for controlling expiration has been proposed as the integrated circuit of a battery-less electronic timer (IBLET). The fundamental idea of controlling expiration is to suppress the error in timing caused by anomalous charge loss, as shown in FIGS. 1-4. FIGS. 1-4 are schematically drawing, illustrating the conventional timer mechanism. In FIGS. 1-4, three time cells (A), (B), and (C) are used to exemplify the above concept. The lifetimes (time to switch-off) of the three cells (A), (B), and (C) are respectively short, middle, and long. Further, these three time cells (A), (B), and (C) are electronically connected in parallel between two terminals, indicated as terminal-1 and terminal-2. The currents through these time cells become zero in sequence of the lifetime of the time cells.

In the initial state, as shown in FIG. 1, the currents flow through all the time cells between the terminals. As the time cell with the shortest lifetime (A) among the three time cells expires firstly progressively with time, the currents through the shortest lifetime (A) become zero, while the currents flow through the remaining time cells with the middle lifetime (B) and with the long lifetime (C), as shown in FIG. 2. As time elapse further, the time cells expire in sequence; and gradually, the currents flow through only the time cell with the longest lifetime (C), as shown in FIG. 3. When the lifetime of the time cell with the longest lifetime (C) expires, the currents through the terminal-1 and terminal-2 reduce to zero, which implies that the electronically connection between the terminal-1 and terminal-2 is terminated, as shown in FIG. 4. Accordingly, a state of electrical electronically connection between the terminals is determined by the time cell with the longest lifetime (C) among the parallel-electronically connected time cells between the terminal-1 and terminal-2.

The time cell can be fabricated by a SSAD structure. However, the aging property of the SSAD structure may be changed due to physical manipulation on the SSAD, such as temperature or the other factors. The physical manipulation usually causes an error of result.

Nothing, however, herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE DISCLOSURE

Embodiments of the present invention are to detect whether or not the physical manipulation is made. Then, a correction can be made with respect to the elapse of time of the timer cells.

An exemplary embodiment of the invention provides a semiconductor device, comprising a first semiconductor substrate and a second semiconductor substrate. Then, a first dielectric layer with a first thickness is formed on a first surface of the first semiconductor substrate. A first floating gate is formed on the first dielectric layer. A first source diffusion region and a first drain diffusion region are respectively formed at two sides of the first floating gate on the first surface of the first semiconductor substrate. A first control gate diffusion region is formed outside the first surface of the first semiconductor substrate, on which the first source diffusion region and the first drain diffusion region are fabricated. The first source diffusion region, the first drain diffusion region, the first floating gate, and the first control gate diffusion region form as a part of a first transistor. A second dielectric layer with a second thickness is formed on a second surface of the second semiconductor substrate, wherein the second thickness is larger than the first dielectric layer. A second floating gate is formed on the second dielectric layer. A second source diffusion region and a second drain diffusion region are respectively formed at two sides of the second floating gate on the second surface of the second semiconductor substrate. A second control gate diffusion region is formed outside the second surface of the second semiconductor substrate, on which the second source diffusion region and the second drain diffusion region are fabricated. The second source diffusion region, the second drain diffusion region, the second floating gate, and the second control gate diffusion region form as a part of a second transistor. A common word line is electrically connected to the first control gate diffusion region and the second control gate diffusion region.

An exemplary embodiment of the invention provides a semiconductor device comprising a first SSAD unit and a second SSAD unit. The first SSAD unit comprises at least one first transistor. The first transistor comprises a first source diffusion region and a first drain diffusion region in a first substrate. A first floating gate is formed over the first substrate. A first control gate is formed on the first substrate separated from the first source diffusion region and the first drain diffusion region. A first dielectric layer with a first thickness is between the first substrate and the first floating gate. The second SSAD unit comprises at least one second transistor. The second transistor comprises a second source diffusion region and a second drain diffusion region in a second substrate. A second floating gate is formed over the second substrate. A second control gate is formed on the first substrate separated from the second source diffusion region and the second drain diffusion region. A second dielectric layer with a second thickness is between the second substrate and the second floating gate and the second thickness is larger than the first thickness. A common word line is electrically connected to the first control gate and the second control gate.

An exemplary embodiment of the invention provides a manipulation detection-correction method on a semiconductor device. The semiconductor device comprises a first solid-state aging devices (SSAD) unit and a second SSAD unit, the first SSAD unit (SSAD1) has at least one first transistor with a first dielectric layer between a first substrate and a first floating gate, and the second SSAD unit (SSAD2) has at least one second transistor with a second dielectric layer between a second substrate and a second floating gate, wherein the second dielectric layer is thicker than the first dielectric layer. The manipulation detection-correction process comprising: performing an initialization step, to obtain a first initial threshold voltage of the first transistor and a second initial threshold voltage of the second transistor; detecting a physical manipulation whether or not occurring on the first transistor and the second transistor, wherein a first threshold voltage shift from the first initial threshold voltage and a second threshold voltage shift from the second initial threshold voltage are measured and converted into a first read time and a second read time, and if a discrepancy between the first read time and the second read time is greater than an time error tolerance, the physical manipulation is detected; and correcting the first read time and the second read time when the physical manipulation is made, by tuning a control voltage to apply to the first floating gate and the second floating gate until the discrepancy between the first read time and the second read time reaches within the time error tolerance and a correction on the first read time and the second read time completes.

Several exemplary embodiments accompanied with figures are described in detail below to further describe the disclosure in details.

It should be understood, however, that this Summary may not contain all of the aspects and embodiments of the present invention, without limiting or restricting any aspects and any exemplary embodiments in any manner, and that the invention as disclosed herein is and will be understood by those of ordinary skill in the art to encompass obvious improvements and modifications thereto.

DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION

Figure 1:
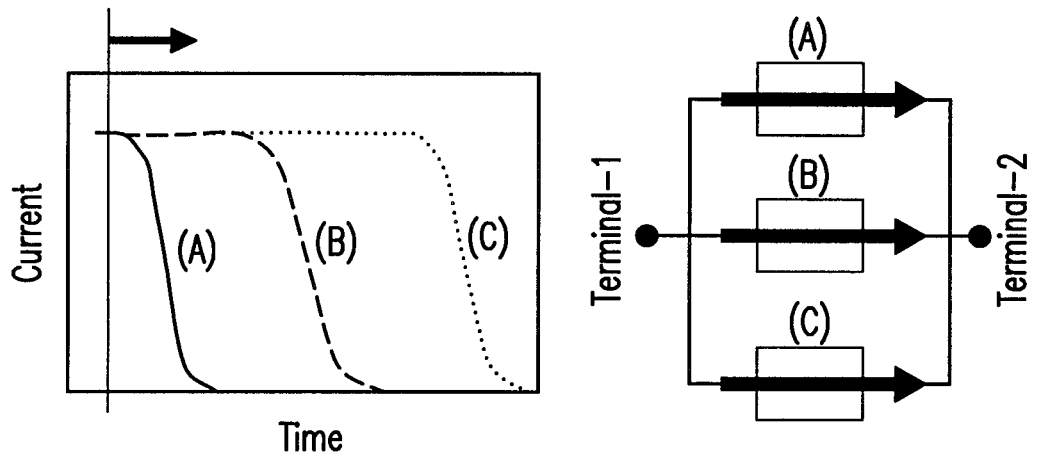
FIGS. 1-4 are schematic diagram illustrating the conventional timer mechanism.
Figure 2:
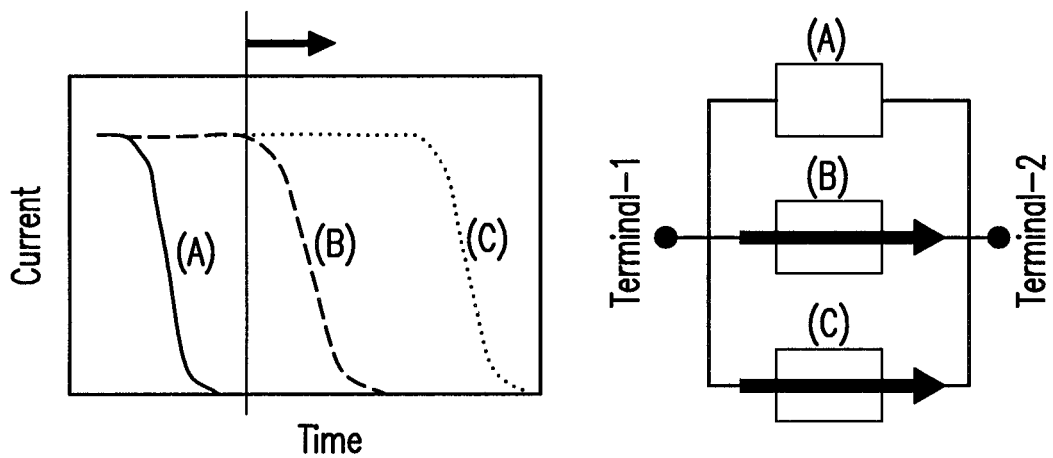
Figure 3:
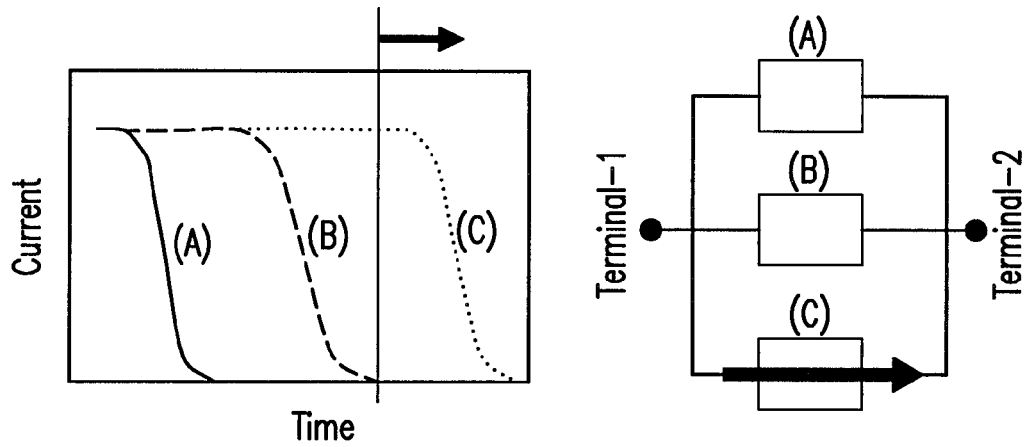
Figure 4:
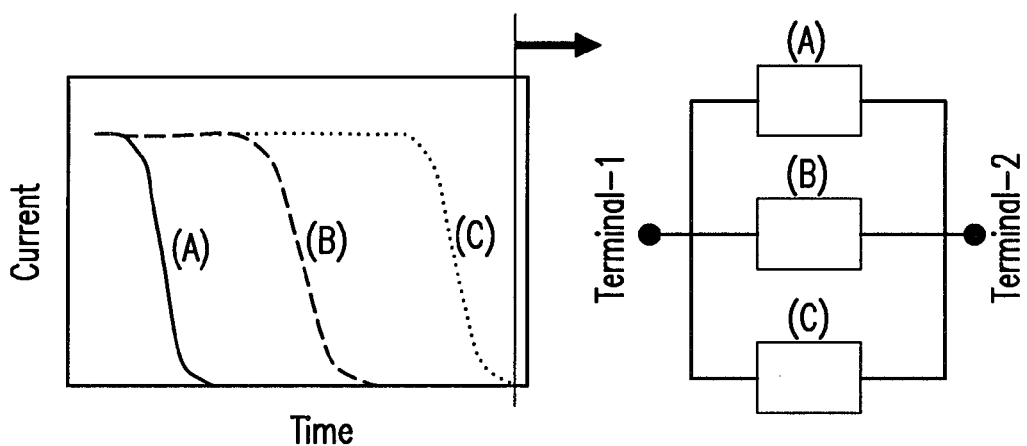

Certain terminology is used in the following description for convenience only and is not limiting any aspects of the present invention. Embodiments of the present invention may comprise any one or more of the novel features described herein, included in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Before disclosing the semiconductor device for applications in the IBLET device, time cell structure of the SSAD is disclosed first.

Figure 5A:
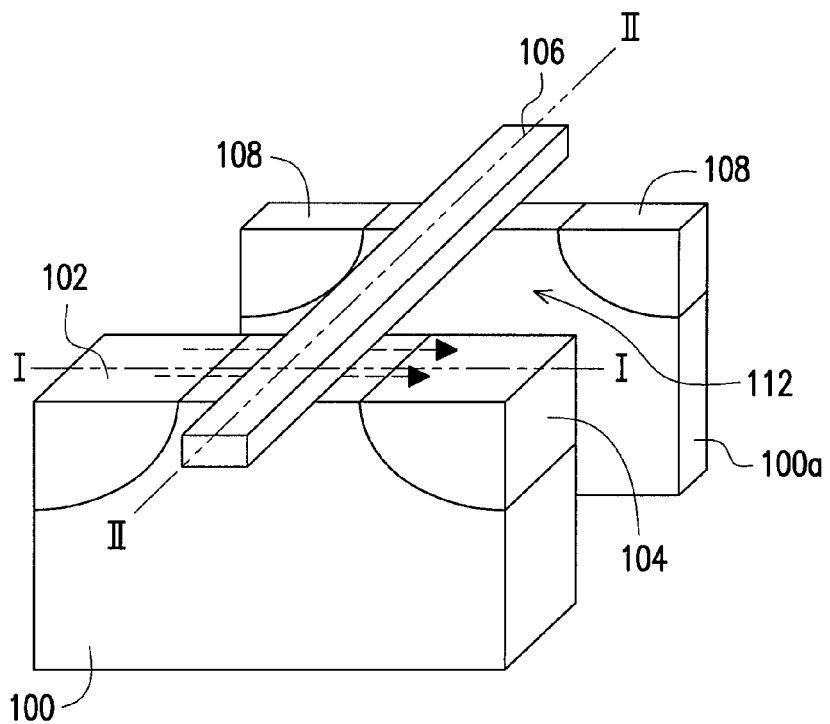
FIG. 5A is a perspective view, schematically illustrating a time cell of a SSAD structure, according to an exemplary embodiment of the present invention.
Figure 5B:
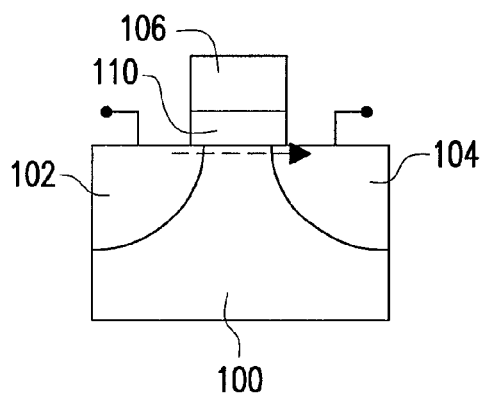
FIG. 5B is a drawing, illustrating a cross-sectional structure of the time cell of the SSAD structure in FIG. 5A.
Figure 5C:
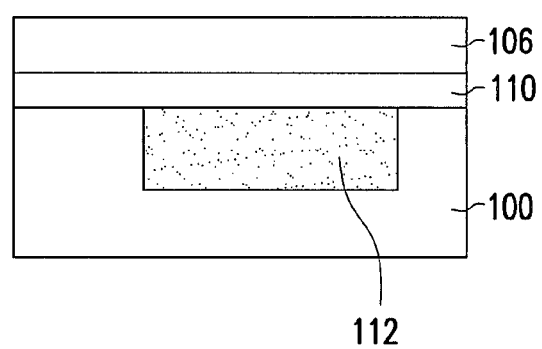
FIG. 5C is a drawing, illustrating another cross-sectional structure of the time cell of the SSAD structure in FIG. 5A.

FIG. 5A is a perspective view, schematically illustrating a time cell of a SSAD structure, according to an exemplary embodiment of the present invention. FIG. 5B is a drawing, illustrating a cross-sectional view of the time cell of the SSAD structure in FIG. 5A at the cutting line I-I. FIG. 5C is a drawing, illustrating another cross-sectional view of the time cell of the SSAD structure in FIG. 5A at cutting line II-II.

In FIGS. 5A-5C, a time cell of the SSAD structure in the perspective view is shown. The time cell is a basic structure as an example to form the SSAD, which is adopted as IBLET device. The time cell in a basic structure of an example includes a substrate 100 of a semiconductor substrate. The substrate 100 is separated by an isolation 112, as seen more specifically in FIG. 5C, into two portions, of which one portion is for forming the basic structure of the transistor with the floating gate (FG) 106 and the other portion 100a of the substrate 100 is for forming the control gate (CG) 108. A source diffusion region 102 and a drain diffusion region 104 are formed in the substrate 100. A dielectric layer 110 is formed on the surface of the substrate 100 and/or 100a. A floating gate 106 is formed on the dielectric layer 110, so the source diffusion region 102 and the drain diffusion region 104 exist at two sides of the floating gate 106. The floating gate 106 is a bar-like layer and extends over the substrate 100 and the other portion 100a. The control gate 108 is formed as a diffusion layer on the substrate 100a.

In this example, the dielectric layer 110 provides the same thickness between the floating gate 106 and the substrate 100 and between the floating gate 106 and the control gate 108.

Figure 6:
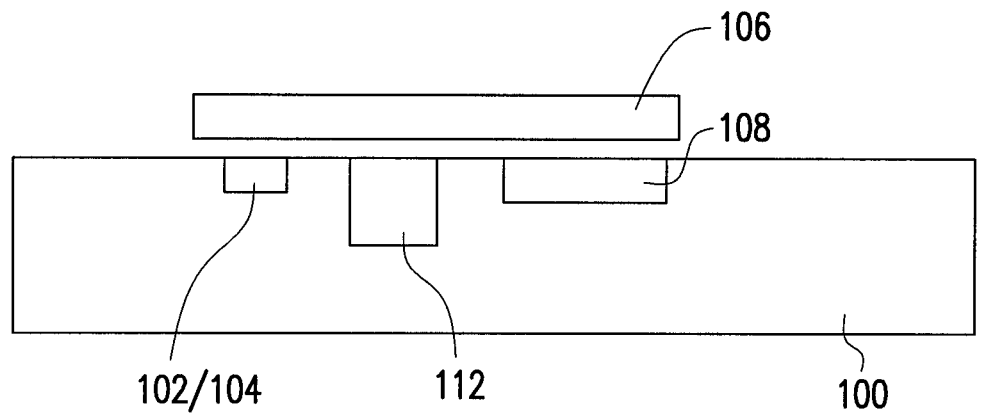
FIG. 6 is a cross-sectional view, schematically illustrating isolation in FIG. 5C.
Figure 7:
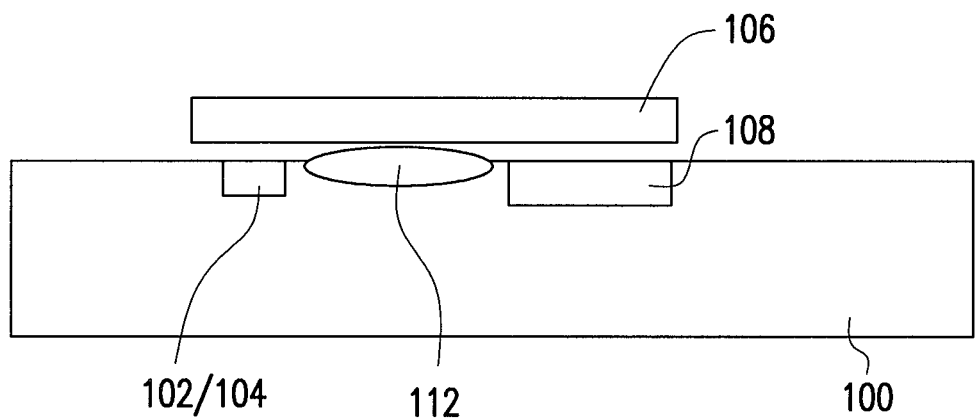
FIG. 7 is a cross-sectional view, schematically illustrating isolation in FIG. 5C.

For the isolation 112, it can be achieved by various manners. FIG. 6 is a cross-sectional view, schematically illustrating isolation in FIG. 5C. In FIG. 6, the isolation 122 is a shallow trench isolation (STI) can isolate the source/drain diffusion region 102/104 from the control gate 108. FIG. 7 is a cross-sectional view, schematically illustrating an isolation in FIG. 5C. In FIG. 7, the isolation 122 is a local oxidation of silicon (LOCOS) isolating the source/drain diffusion region 102/104 from the control gate 108. Even further as shown in FIG. 5A, if the separating distance between the source/drain diffusion region 102/104 and the diffusion region of the control gate 108 is sufficiently large, the isolation function can be achieved.

Figure 8:
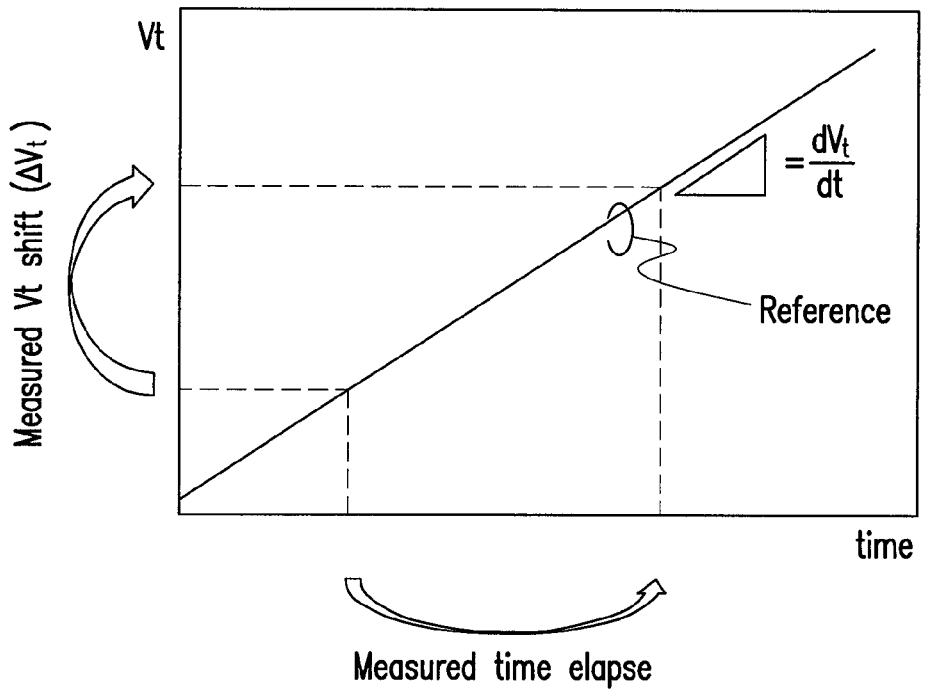
FIG. 8 is a drawing, schematically illustrating a relationship of threshold voltage (Vt) shift and the time elapse, according to an exemplary embodiment of the invention.

Now, the relation of the time elapse and the threshold voltage of the transistor of time cell is described. FIG. 8 is a drawing, schematically illustrating a relationship of threshold voltage (Vt) shift and the time elapse, according to an exemplary embodiment of the invention.

In FIG. 8, ideally, the threshold voltage (Vt) of the transistor of the time cell is increased progressively with time. The time elapse can be obtained from the measured Vt shift.

Figure 9:
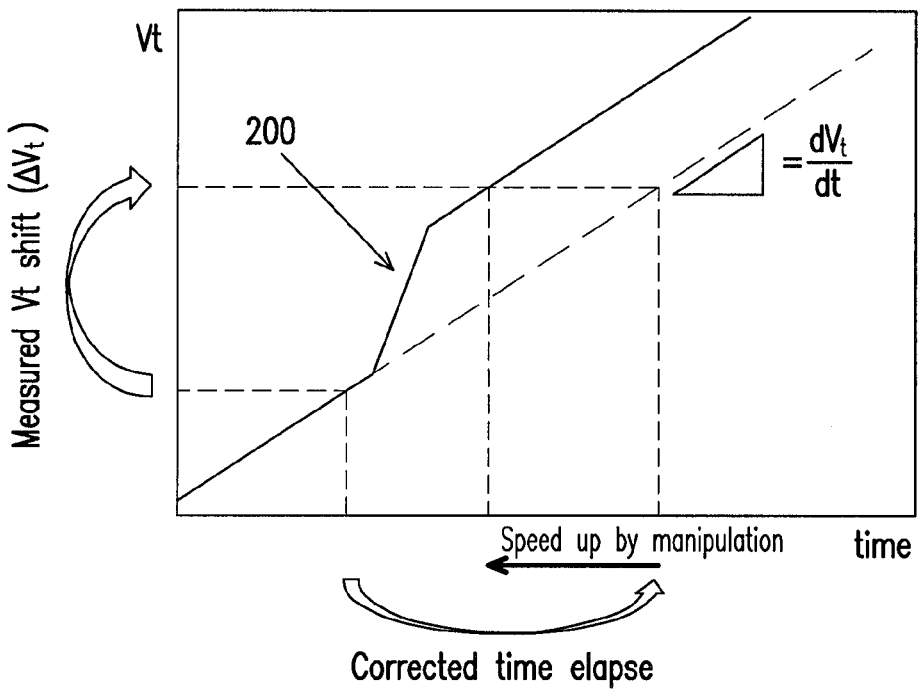
FIG. 9 is a drawing, schematically illustrating a relationship of threshold voltage (Vt) shift and the time elapse when a physical manipulation is made on the time cell, according to an exemplary embodiment of the invention.

However, a physical manipulation can change this relationship. FIG. 9 is a drawing, schematically illustrating a manipulated relationship of threshold voltage (Vt) shift and the time elapse when a physical manipulation is made on the time cell. The physical manipulation can be in various factors, such as heat, electromagnetic field, radiation, or unknown physical effect. When the physical manipulation is made, the slope of threshold voltage with respect to time elapse is changed. Here in the embodiment, the slope of threshold voltage is increased as an example of acceleration when the physical manipulation is made during at the period 200. It turns out a speed-up to the same amount of the threshold voltage (Vt) shift, compared with the correct time elapse in FIG. 8.

Figure 10:
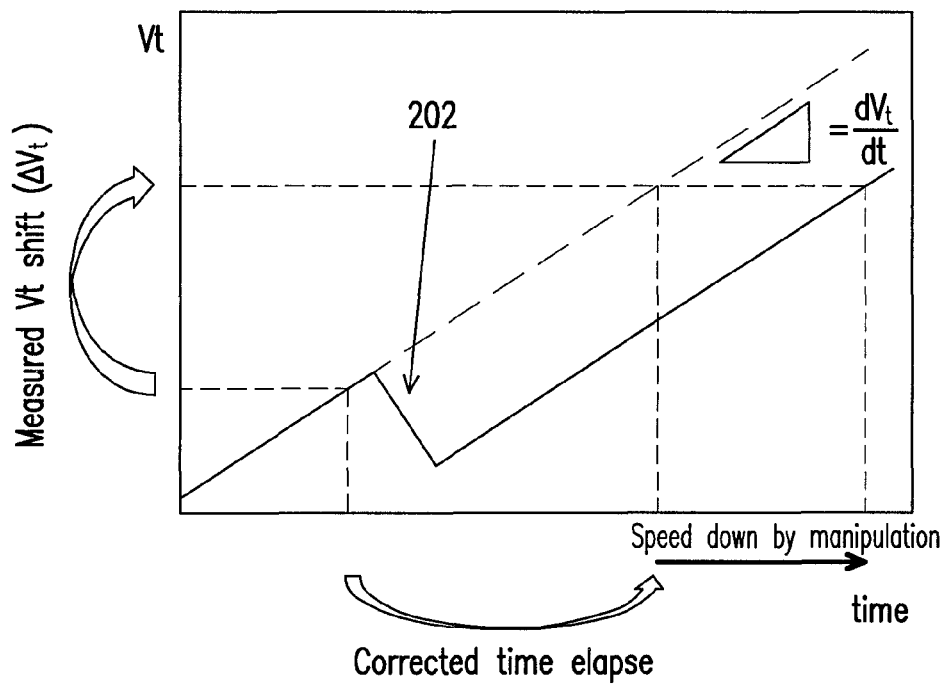
FIG. 10 is a drawing, schematically illustrating a relationship of threshold voltage (Vt) shift and the time elapse when a physical manipulation is made on the time cell, according to an exemplary embodiment of the invention.

FIG. 10 is a drawing, schematically illustrating a relationship of threshold voltage (Vt) shift and the time elapse when a physical manipulation is made on the time cell. Here in the embodiment of FIG. 10, the slope of threshold voltage is decreased as an example of delay when the physical manipulation is made during at the period 202. It turns out a speed-down to the same amount of the threshold voltage (Vt) shift, compared with the correct time elapse in FIG. 8.

As can been seen from FIG. 9 and FIG. 10, the time elapse may be speeding up or speeding down due to physical manipulation. The correction is necessary to be done until recovering the correct time elapse.

Figure 11:
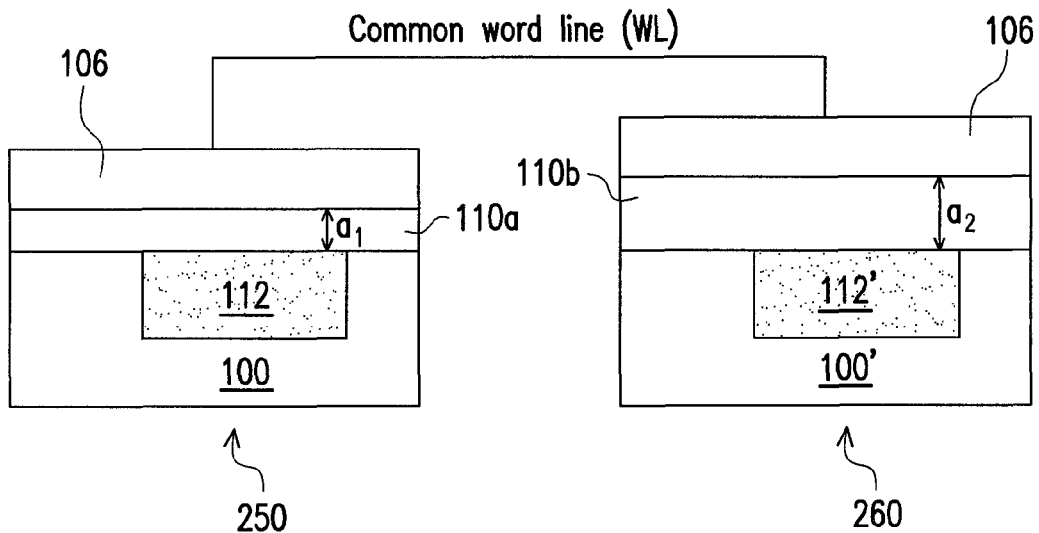
FIG. 11 is a cross-sectional view, schematically illustrating a device structure composed of SSAD, according to an exemplary embodiment of the invention.

FIG. 11 is a cross-sectional view, schematically illustrating a device structure, according to an exemplary embodiment of the invention. In FIG. 11, based on the structure in FIGS. 5A-5C, the SSAD is proposed as composed of two time cells with different thickness of the dielectric layers, which causes different threshold voltages for different transistor of the time cells.

One transistor 250 includes the substrate 100, the isolation 112, the dielectric layer 110a, served as a dielectric layer above the surface of the substrate, on which the floating gate 106 is fabricated. The dielectric layer 110a has a thickness $a_1$. Another transistor 260 includes the substrate 100', the isolation 112', the dielectric layer 110b, served as a dielectric layer above the surface of the substrate, on which the floating gate 106 is fabricated. In fabrication, the substrate 100 and the substrate 100' may be the same substrate of a wafer. However, since the transistor 250 and the transistor 260 are separately fabricated, they are not the common substrate.

A common word line (WL) may apply the operation voltage to the control gate seen in FIG. 5A. It should be noted that the dielectric layer 110b has the thickness $a_2$, which is larger than the thickness $a_1$. In other words, there are at least two time cells, in which the thicknesses of the dielectric layers are different. The different thickness may cause two relationship lines of Vt-shift and time but different slopes as to be described later.

Figure 12:
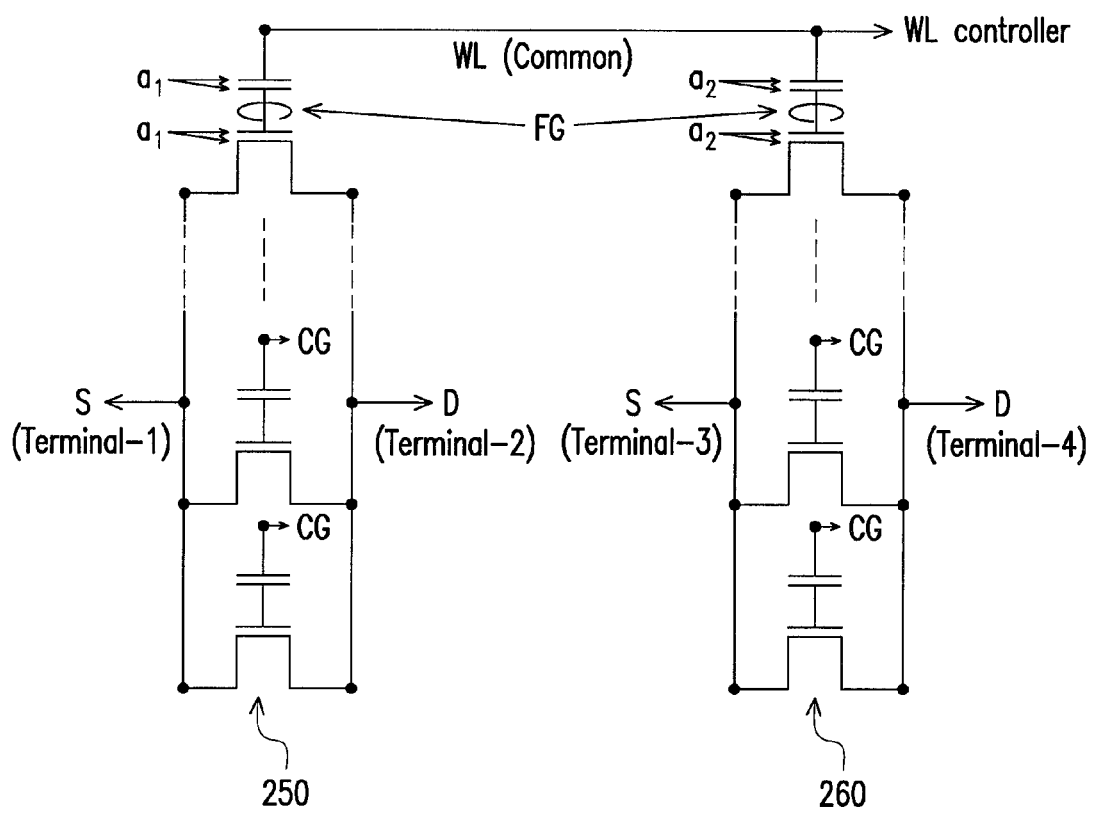
FIG. 12 is a circuit drawing, schematically illustrating an equivalent circuit, according to an exemplary embodiment of the invention.

FIG. 12 is a circuit drawing, schematically illustrating the SSAD, according to an exemplary embodiment of the invention. In FIG. 12, the SSAD in circuit structure may be divided into two groups of time cells. A first group of time cells is formed from multiple transistors 250, electrically connected in parallel between a terminal-1 electronically connected to the source diffusion region (S) and a terminal-2 electronically connected to the drain diffusion region (D), as an example. The transistor 250 has the dielectric layer with the thickness being $a_1$. The transistor 250 can be illustrated in FIGS. 5A-5C as an example. Likewise, the second group of time cells is formed from multiple transistors 260, electrically connected in parallel between a terminal-3 electronically connected to the source diffusion region (S) and a terminal-4 electronically connected to the drain diffusion region (D), as an example. The transistor 260 has the dielectric layer with the thickness being $a_2$. It should be noted that $a_2$ is larger than $a_1$.

Figure 13:
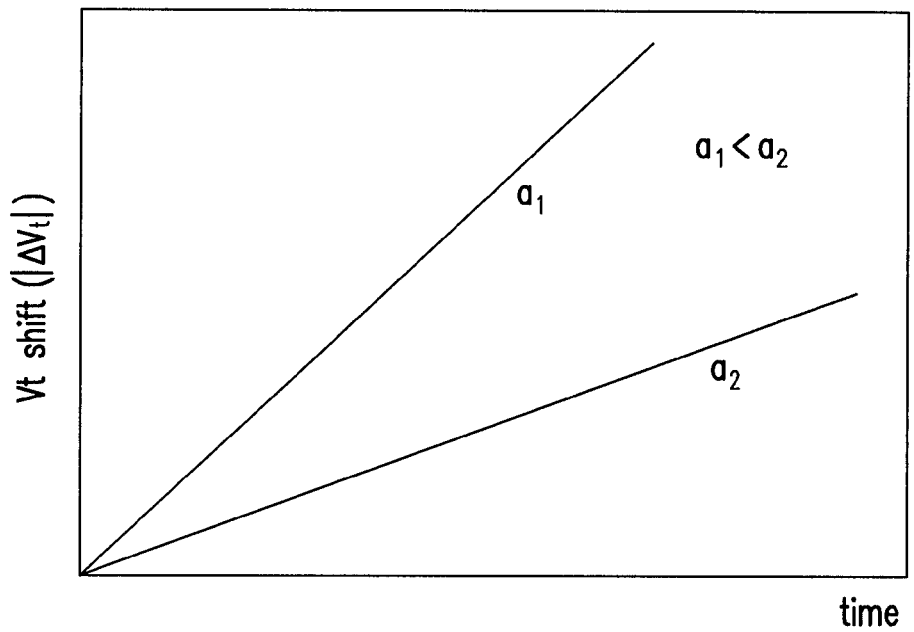
FIG. 13 is a drawing, schematically illustrating two relationships of threshold voltage (Vt) shift and the time elapse for different thicknesses of dielectric layer, according to an exemplary embodiment of the invention.

FIG. 13 is a drawing, schematically illustrating two relationships of threshold voltage (Vt) shift and the time elapse for different thicknesses of dielectric layer, according to an exemplary embodiment of the invention. Based on the two types of transistors 250 and 260, the relationship of the Vt shift to the time elapse are in two lines with different slopes (dVt/dt). The line of transistor 250, whose dielectric layer thickness is $a_1$, has a larger slope while the line of transistor 260, whose dielectric layer thickness is $a_2$, has a smaller slope.

Figure 14:
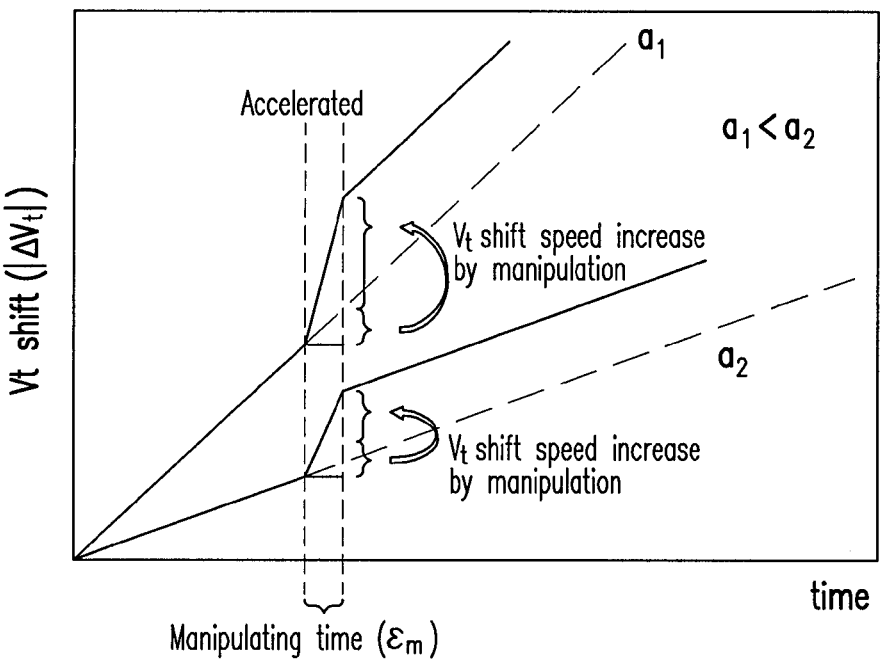
FIG. 14 is a drawing, schematically illustrating a relationship of threshold voltage (Vt) shift and the time elapse when a physical manipulation is made on the time cells, according to an exemplary embodiment of the invention.
Figure 15:
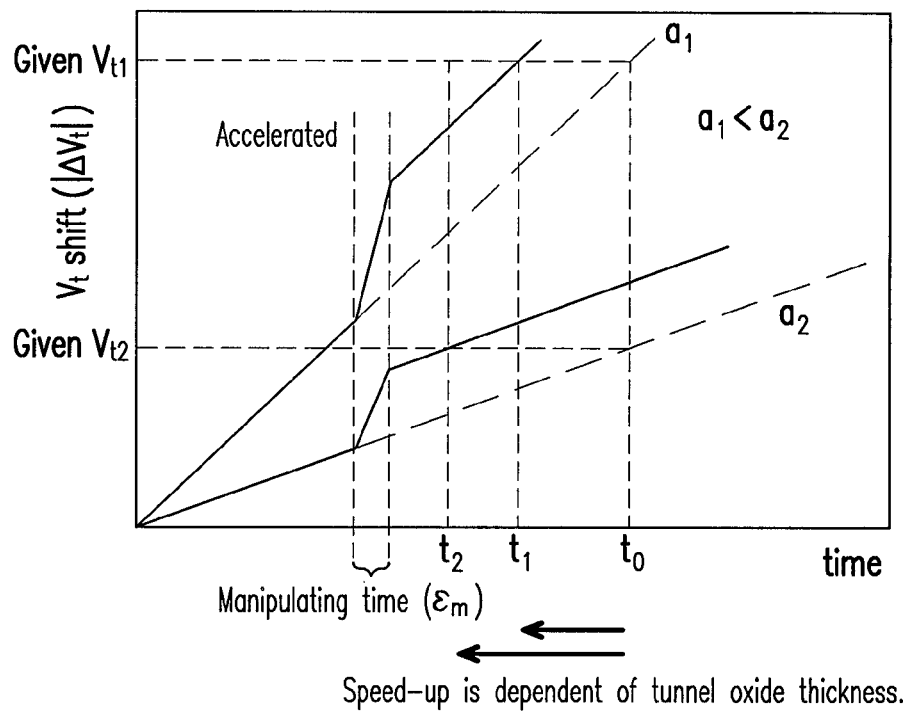
FIG. 15 is a drawing, schematically illustrating a manipulated time elapse when a physical manipulation is made, according to an exemplary embodiment of the invention.

FIG. 14 is a drawing, schematically illustrating a relationship of threshold voltage (Vt) shift and the time elapse when a physical manipulation is made. Likewise in FIG. 9, a manipulation is made on the two transistors 250 and 260 at the same moment during a manipulation time $\epsilon_m$. The time elapse read from these lines are accelerated at the same moment and are different, as shown in FIG. 15.

Figure 16:
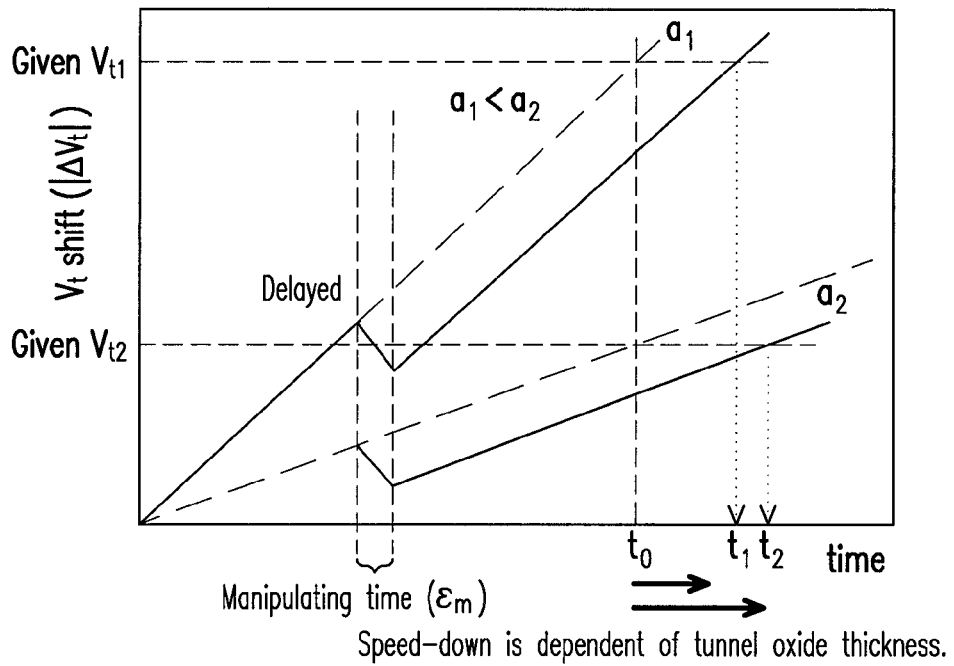
FIG. 16 is a drawing, schematically illustrating a manipulated time elapse when a physical manipulation is made, according to an exemplary embodiment of the invention.

If the IBLET, as shown in FIGS. 11 and 12, is manipulated by the physical manipulation, the SSAD1 and SSAD2 composing this IBLET are manipulated at the same moment. In the example of FIG. 15 to be further described later, both of the SSAD1 and SSAD2 are accelerated at the same moment with the same physical manipulation. Since the tunnel dielectric thicknesses of SSAD1 and SSAD2 are different, the read times are different. The discrepancy between the read time of SAAD1 ($t_1$) and that of SSAD2 ($t_2$) is calculated by the equation:

$$t_1 - t_2 = \varepsilon_m \Delta E_{F0} \frac{1}{2\alpha\sqrt{\phi_B - E_{F0}}} \left( \frac{1}{a_1} - \frac{1}{a_2} \right), \quad (1)$$

where $\phi_B$ is the barrier height of dielectric layer, $E_{F0}$ is the Fermi level of the floating gate, and $\Delta E_{F0}$ is the Fermi level change by physical manipulation. The $\alpha$ is described below. In FIG. 15, the relationship between $t_1$, $t_2$ and $t_0$ are illustrated, where $t_0$ is a read time with no manipulation. Note that $t_2 < t_1 < t_0$ in a case of acceleration while $a_0 < a_2$. In the example of FIG. 16 to be further described later, both of the SSAD1 and SSAD2 are delayed at the same moment with the same physical manipulation while $a_1 < a_2$. Here note that $t_0 < t_1 < t_2$.

If both SSAD1 and SSAD2 are accelerated at the same moment, then $t_2 < t_1 < t_0$ while $a_1 < a_2$. If both SSAD1 and SSAD2 are delayed at the same moment, $t_0 < t_1 < t_2$ while $a_1 < a_2$. This property is useful to detect the manipulation and to correct the manipulated elapse of time.

FIG. 15 is a drawing, schematically illustrating the mechanism for acceleration of read time by a physical manipulation. In FIG. 15, for the measured threshold voltages Vt1 and Vt2, they shall ideally result in the same read time t0, measured from the initial threshold voltages Vt10 and Vt20, respectively, while no physical manipulation is made. However, with the acceleration by the manipulation, the read of the line with thickness $a_1$ is reduced to $t_1$ and the read time of the line with thickness $a_2$ is reduced to $t_2$. The time elapse $t_1$ and $t_2$ are shorter than the time elapse $t_0$. The speed-up rate depends on the thickness $a_1$ and $a_2$ in transistors 250 and 260, respectively.

FIG. 16 is a drawing, schematically illustrating the mechanism for delay of read time by a physical manipulation. In FIG. 16, the manipulation causes the time elapse delayed to the read time $t_1$ and $t_2$, depending on the thickness $a_1$ and $a_2$ in transistors 250 or 260, respectively. The read time $t_1$ and $t_2$ are greater than the read time $t_0$ in the case of the delay by physical manipulation.

The issues in FIGS. 15 and 16 are to correct the read time to obtain the correct time. In the following descriptions, some procedures shall be explained based on the SSAD structure shown in FIG. 12, as an example.

An initialization procedure may be performed to get the ignition condition for the threshold voltage and the initial time. The initialization threshold voltage can then be treated as the zero in drawings of the relationship.

Figure 17:
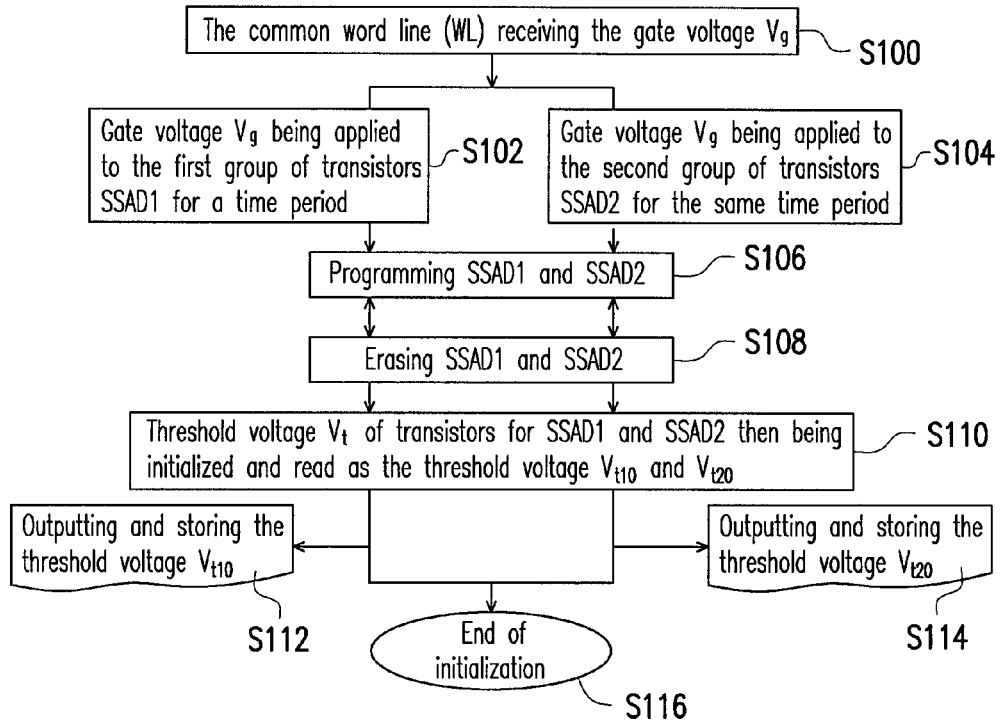
FIG. 17 is an initialization procedure according to an exemplary embodiment of the invention.

FIG. 17 is an initialization procedure according to an exemplary embodiment of the invention. In FIG. 17, at step S100, the common word line (WL) receives the gate voltage Vg. In step S102, the gate voltage Vg is applied to the first group of transistors SSAD1 for a time period from the common word line (WL). In step S104, the gate voltage Vg is applied to the second group of transistors SSAD2 for the same time period from the common word line (WL). It can be noted here that the step S102 and the step S104 may be performed simultaneously. The first group of transistors SSAD1 has a thickness $a_1$ for the dielectric layer whose capacitance coupling ratio to gate dielectric layer is a constant Cr in design, for example. The second group of transistors SSAD2 has a thickness $a_2$ for the dielectric layer whose capacitance coupling ratio to gate dielectric layer is the same constant Cr in design, for example. In step 106 and step 108, the programming process in step S106 and the erasing process in step S108 are alternatively performed for several times on the two groups of transistors SSAD1 and SSAD2, such as 10 times for programming and erasing. It is preferable that this step ends with erasing. After then, the threshold voltage Vt shall be stable. In step S110, the threshold voltage Vt of transistors can be initialized by programming and erasing when the last step ends with erasing and programming, respectively. As a result, the threshold voltage $V_{t10}$ for SSAD1 and $V_{t20}$ for SSAD2 shall be obtained. In step S112 and step S114, the initialized threshold voltage $V_{t10}$ for SSAD1 and $V_{t20}$ for SSAD2 shall be output and stored. In step S116, the initialization procedure completes.

Figure 18:
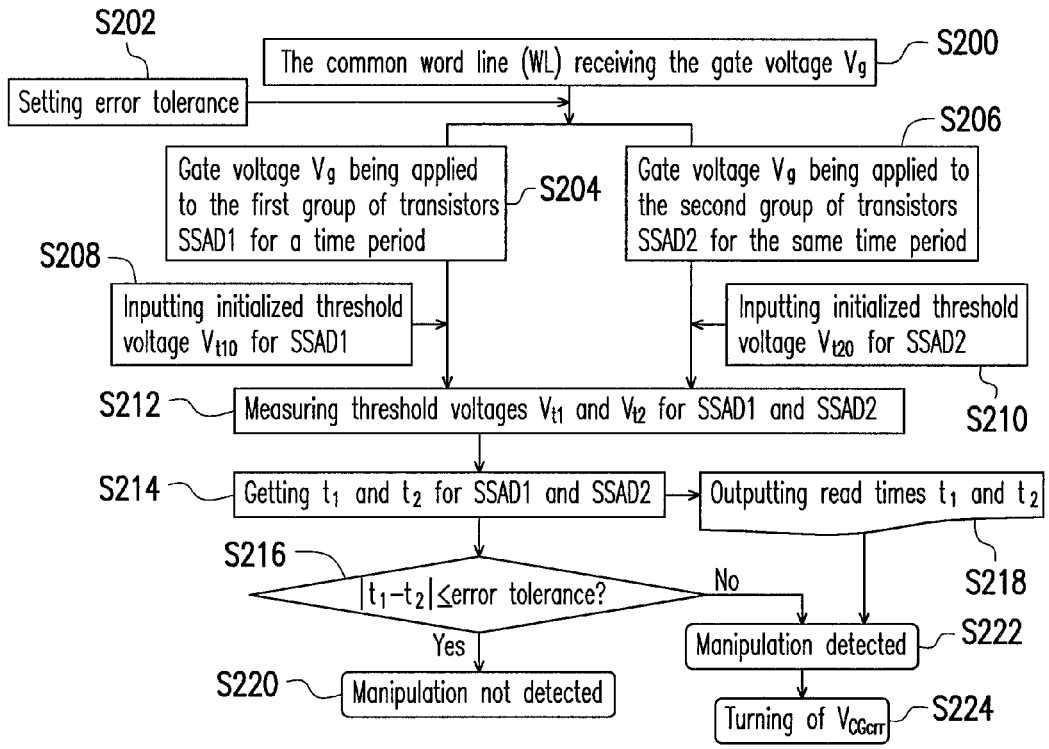
FIG. 18 is a procedure, schematically illustrating detecting whether or not the physical manipulation is made, according to an exemplary embodiment of the invention.

FIG. 18 is a procedure, schematically illustrating detecting whether or not the physical manipulation is made, according to an exemplary embodiment of the invention. In FIG. 18, at step S200, the common word line (WL) receives the gate voltage Vg. In structure, the common word line (WL) is electronically connected to the control gates of both of SSAD1 and SSAD2 whose dielectric layer, such as oxide layer, have thicknesses $a_1$ and $a_2$, respectively, while the capacitance coupling ratios are the same Cr. The parameters of $a_1$, $a_2$, and Cr are predetermined at the device design level. In step S202, an error tolerance, used later to determine whether or not the manipulation is made, can be set beforehand. In steps S204, the gate voltage Vg is applied to the SSAD1 for a time period. In step S206, the gate voltage Vg is also applied to the SSAD2 for the same time period. For the connection structure of the common word line (WL) in an example, the gate voltage Vg is applied to the SSAD1 and SSAD2 at the same time. In step 208 and step 210, the initialized threshold voltage $V_{t10}$ and $V_{t20}$ are input for reference of the SSAD1 and SSAD2. In step 212, the threshold voltages $V_{t1}$ and $V_{t2}$ for the SSAD1 and SSAD2 are measured, respectively. Here, the threshold voltage is subtracted by the initial threshold voltages to obtain the Vt-shifts, $|\Delta V_{t1}|$ and $|\Delta V_{t2}|$, respectively, where $\Delta V_{t1} = V_{t1} - V_{t10}$ and $\Delta C_{t2} = V_{t2} - V_{t20}$. Here note that $V_{t10}$ and $V_{t20}$ are defined in FIG. 17. In step S214, in the case of acceleration (illustrated FIG. 15) and in the case of delay (illustrated in FIG. 16), an estimation of $t_1$ and $t_2$ is made for SSAD1 and SSAD2, respectively. In step S216, the difference of $|t_1-t_2|$ is compared with the error tolerance set in step S202, for example. In step S218, the $t_1$ and $t_2$ are output for later use in step S222. The step S202 can be made at anytime before the step S216, practically. If $|t_1-t_2|$ is smaller than the error tolerance in step S216, then it can be concluded that the external physical manipulation is regarded as not-detected, and the procedure ends at step S220. In step S216, if the $|t_1-t_2|$ is not smaller than the error tolerance, then the physical manipulation is regarded as detected. The times $t_1$ and $t_2$ are passed to the step S226 for correcting the time elapse. In step S224, the correction voltage $V_{CGcrr}$ is tuned with respect to $t_1$ and $t_2$, which may be applied to the control gates of SSAD1 and SSAD2 at the same moment.

For the step S224 to tune the correction voltage $V_{CGcrr}$, it can be done according to equations (2)-(3), derived theoretically:

$$V_{CG_{crr}} = \frac{2\alpha}{\varepsilon_{crr}} \frac{t_1 - t_2}{qC_r} \frac{a_1 a_2}{a_2 - a_1} \sqrt{\phi_B - E_{F0}}, \quad (2)$$

$$\alpha = \frac{\sqrt[2]{2m_{tunnel}}}{\hbar}. \quad (3)$$

Usually, $\sqrt{\phi_B-E_{F0}}$ can be calculated as $\sqrt{3.3eV}$. The time $t_1$ is the manipulated read time of SSAD1, the time $t_2$ is the manipulated read time of SSAD2, the thickness $a_1$ is for the first dielectric layer thickness, the thickness $a_2$ is for the second dielectric layer thickness, $m_{tunnel}$ is the tunnel mass of the first and second dielectric layers that are determined with an independent experiment, q is the elementary charge, the $C_r$ is the capacitance coupling ratio of the gate capacitance of each transistors to each control gate capacitance, $\epsilon_{crr}$ is a predetermined correction time, ℏ is the Plank constant divided by $2\pi$. As a result, $C_{CGcrr}$ can be generally expressed by Equation (4):

$$V_{CG_{crr}} = k \frac{t_1 - t_2}{\varepsilon_{crr}} \frac{a_1 a_2}{a_2 - a_1}, \quad (4)$$

where k is a proportional constant.

Figure 19:
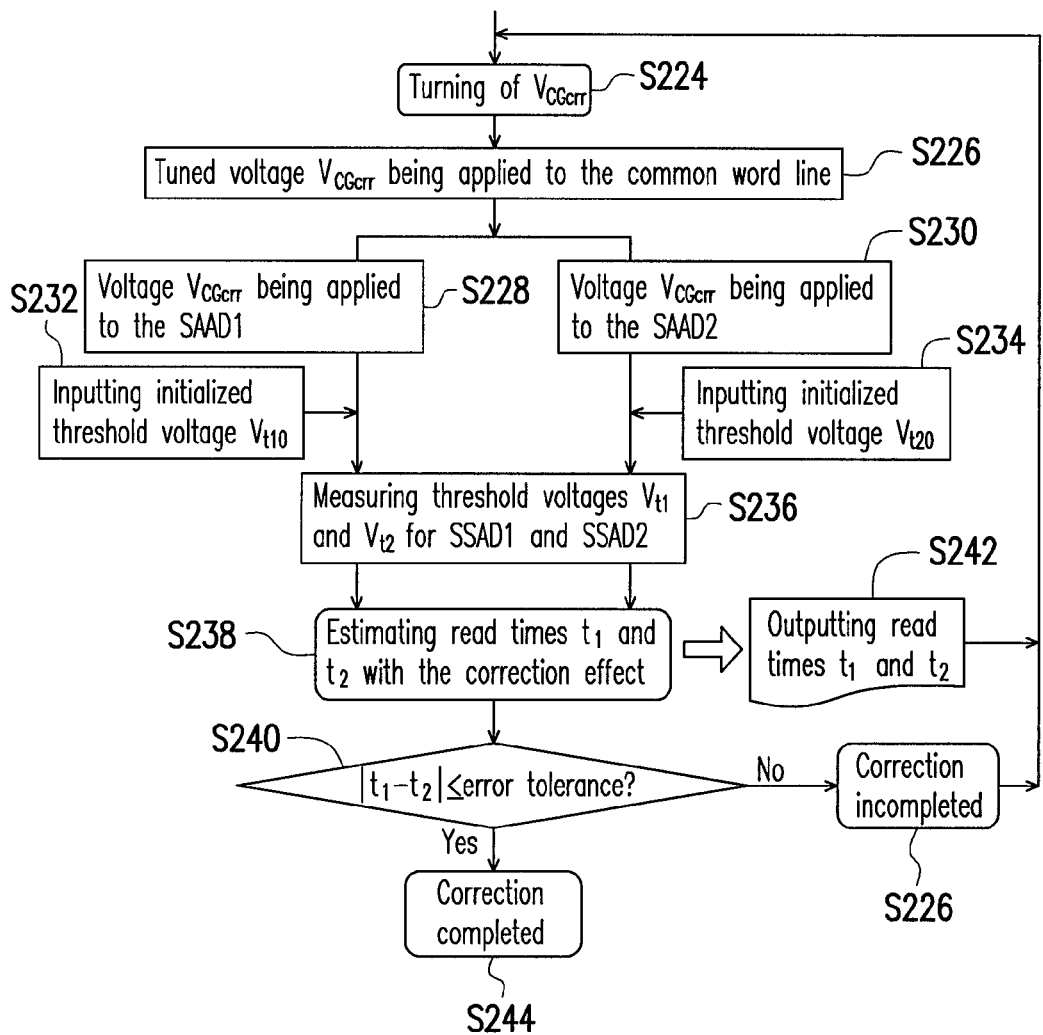
FIG. 19 is a procedure, schematically illustrating the mechanism for correcting the manipulated time elapse, according to an exemplary embodiment of the invention.

In continuing from the step S224 in FIG. 18, a correcting procedure is performed. FIG. 19 is a procedure, schematically illustrating the mechanism for correcting the time elapse, according to an exemplary embodiment of the invention. In FIG. 19, starting from the step 224 in FIG. 18, the tuned voltage $V_{CGcrr}$ is applied to the common word line in step S226. In step S228, the voltage $V_{CGcrr}$ is applied to the SSAD1. In step S230, the voltage $V_{CGcrr}$ is applied to the SSAD2. As previously described, the voltage $V_{CGcrr}$ may be applied to the SSAD1 and SSAD2 at the same moment. In steps S232 and 234, the initialized threshold voltages $V_{t10}$ and $V_{t20}$ are respectively input. In step S236, the threshold voltages $V_{t1}$ for SSAD1 and $V_{t2}$ for SSAD2 are measured. In step S238, the read times $t_1$ and $t_2$ are again estimated with the correction effect. The correction effect is to be described later in FIGS. 20-28. In step S238, the read time $t_1$ and $t_2$ is updated and output in step S242 for iterating to step S224 if necessary. In step S240, if the discrepancy of time, $|t_1-t_2|$, is less than the error tolerance, then leading to the correction complete in step S244. However, if the discrepancy of time $|t_1-t_2|$, is not less than the error tolerance, then in step S226, it is concluded that the correction is incomplete. The procedure goes back to the step S224 for further iteration.

Figure 24:
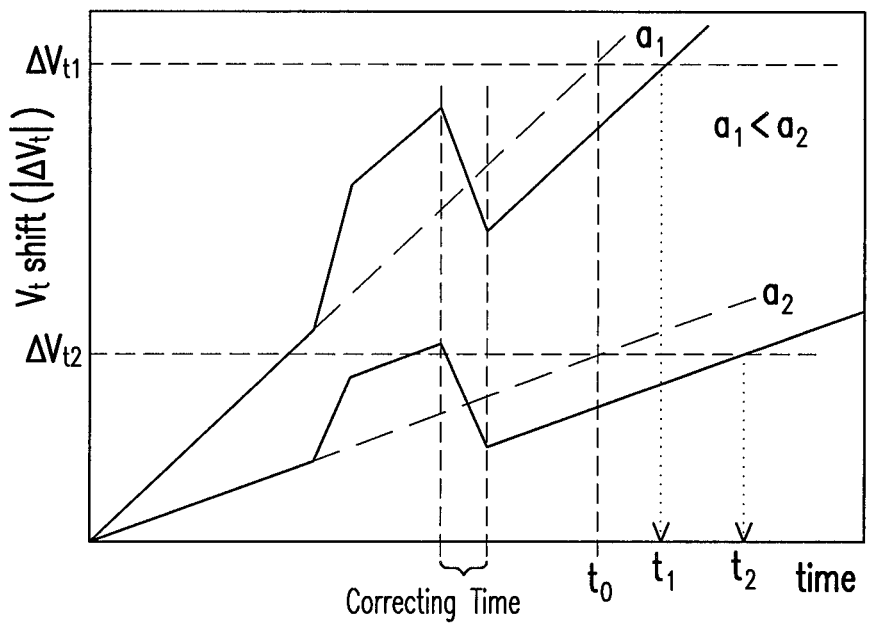

FIGS. 20-23 are drawings, schematically illustrating the relationship of Vt shift and time elapse while correcting the read time after accelerative manipulation is made, according to an exemplary embodiment of the invention. FIG. 24 is a drawing, schematically illustrating the relationship of Vt shift and time elapse when the correction is made according to an exemplary embodiment of the invention. FIGS. 25-28 are drawings, schematically illustrating the relationship of Vt shift and time elapse while the correction is iterated, according to an exemplary embodiment of the invention.

Figure 20:
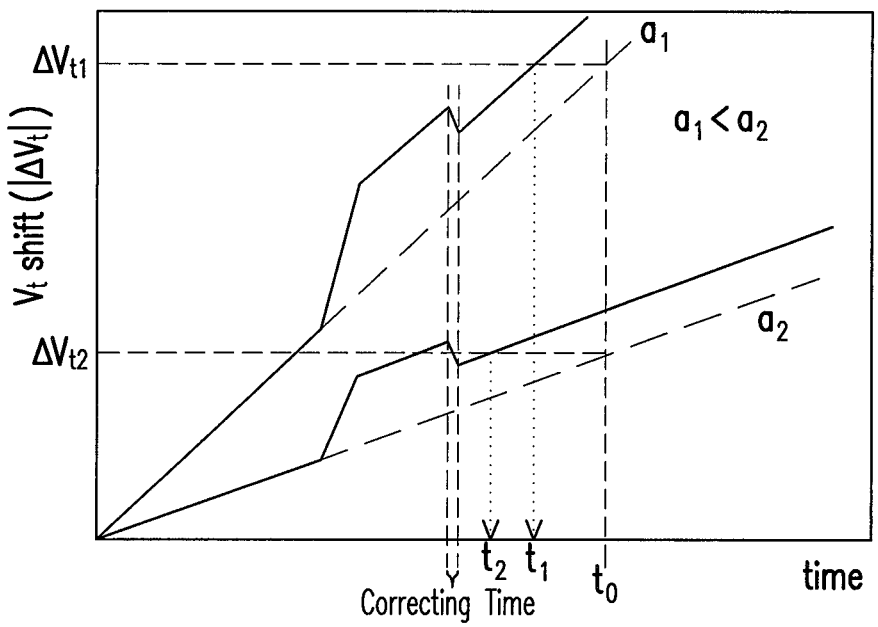
FIGS. 20-28 are drawings, schematically illustrating the relationship of Vt shift and time elapse while a correcting bias is applied after the manipulation is detected, according to an exemplary embodiment of the invention.

In FIG. 20, when the accelerative manipulation is detected, it is needed to delay the read time. In the beginning, the correction is set to partially delay. The $V_{CGcrr}$ is applied to the control gate of both SSAD1 and SSAD2 at the same moment. The gate voltage applied to the control gate causes the partial correction. As a result, the difference $t_1-t_2$ is practically decreased while a1<a2. The Vt-shift of both SSAD1 and SSAD2 are measured from $V_{t10}$ and $V_{t20}$ of the initial values obtained from the steps S232 and S234 of FIG. 19, respectively.

Figure 21:
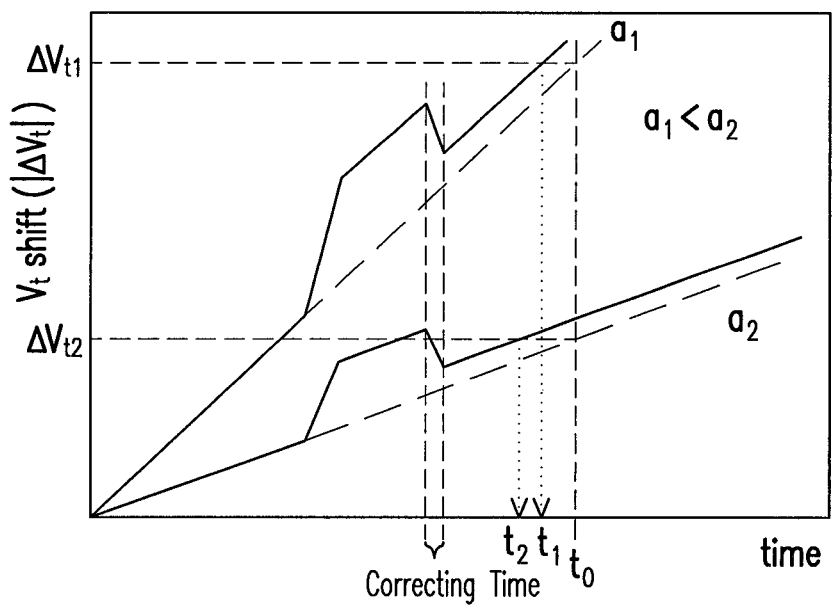
Figure 22:
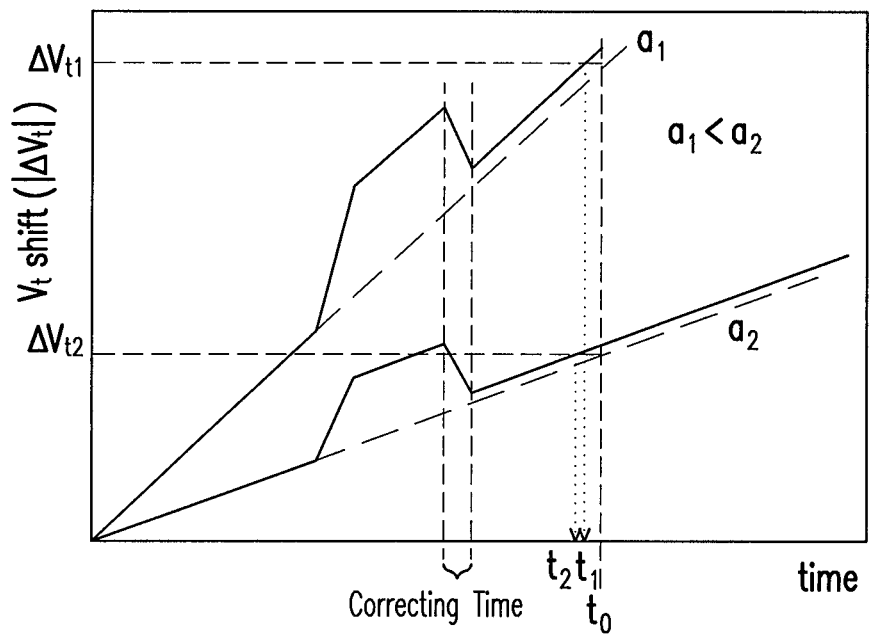
Figure 23:
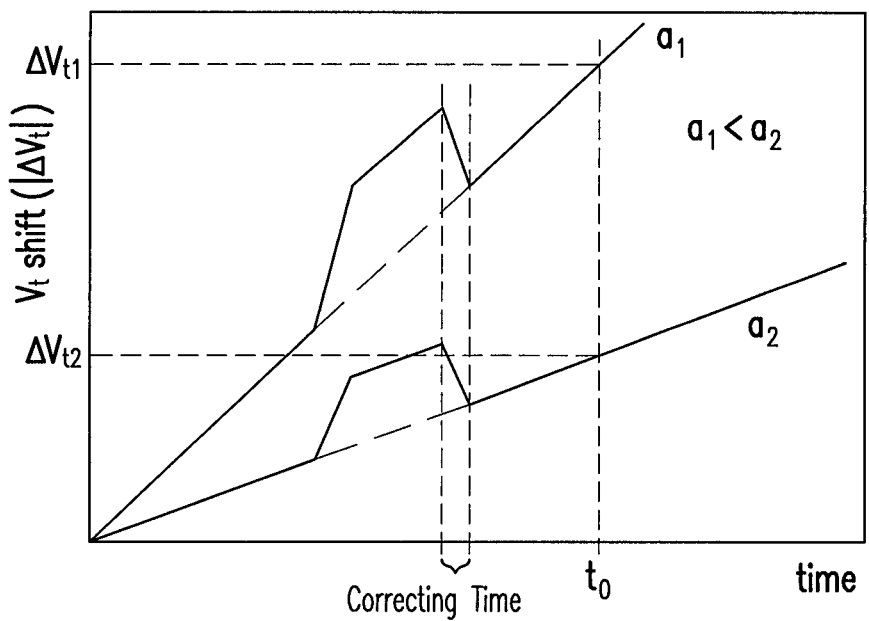
Figure 25:
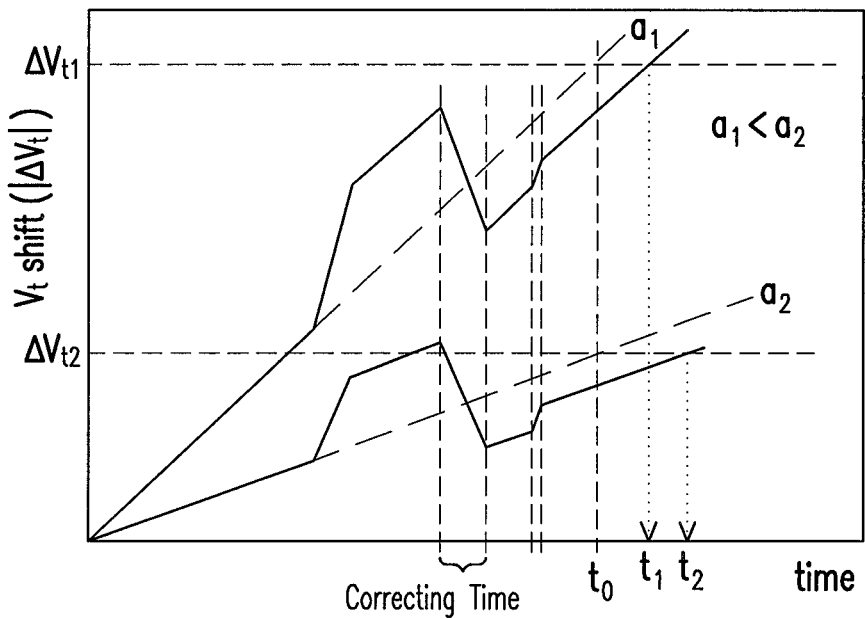
Figure 26:
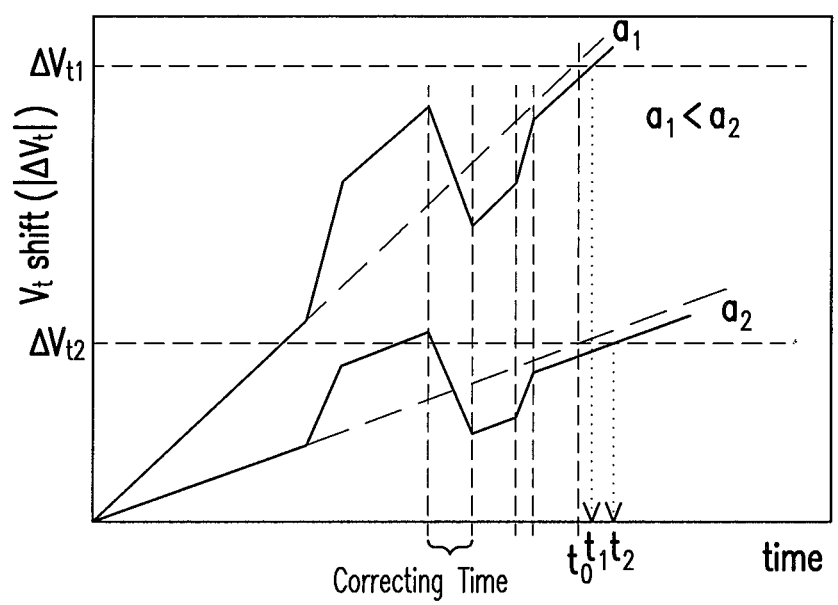
Figure 27:
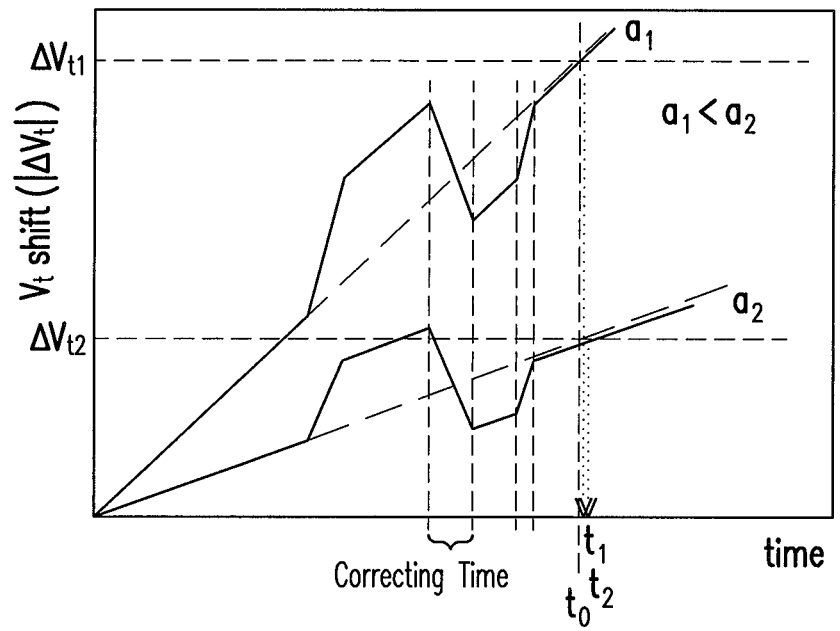
Figure 28:
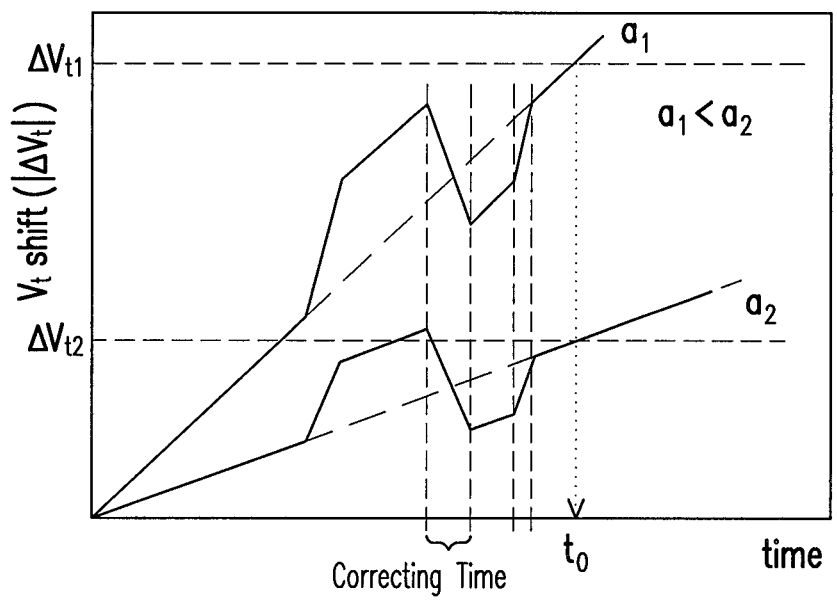

The discrepancies between $t_1$ and $t_2$ and between $t_1$ and $t_0$ are shrunk compared with the situation at the beginning. However, while the discrepancy between $t_1$ and $t_2$ is larger than the predetermined error tolerance, the partial correction shall be iterated. In FIG. 21, when the partial correction is further made, the discrepancy between $t_1$ and $t_2$ becomes further smaller in FIG. 22. Finally, in FIG. 23, the discrepancy between $t_1$ and $t_2$ is smaller than the predetermined error tolerance. Then, the correction is completed, and $t_2$ and $t_1$ are merged to $t_0$ at the same moment. If the partial correction is an over-delay, as illustrated in FIG. 25, $t_2$ is larger than $t_1$, while $t_1$ is larger than $t_0$. This situation is similar to the delay manipulation, and the magnitude correlation of $t_1$ and $t_2$ is reversed. Since the $V_{CGcrr}$ changes the sign, the correction operation is changed from the partial delay to the partial acceleration, in which $t_1-t_2$ is negative, as shown in Eq. (2). If the partial delay is a controlled slow-erasing, the partial acceleration is a controlled slow-programming, according to Eq. (2). If the partial delay is a controlled slow-programming, the partial acceleration is a controlled slow-erasing according to Eq. (2). The Vt-shift defined as an absolute value is plotted in FIGS. 20-28. As shown in FIGS. 26-28, $t_1$ and $t_2$ are repeatedly corrected until they will reach $t_0$. Then, the relationship of Vt-shift and the time elapse is corrected back to the ideal relationship.

Figure 29:
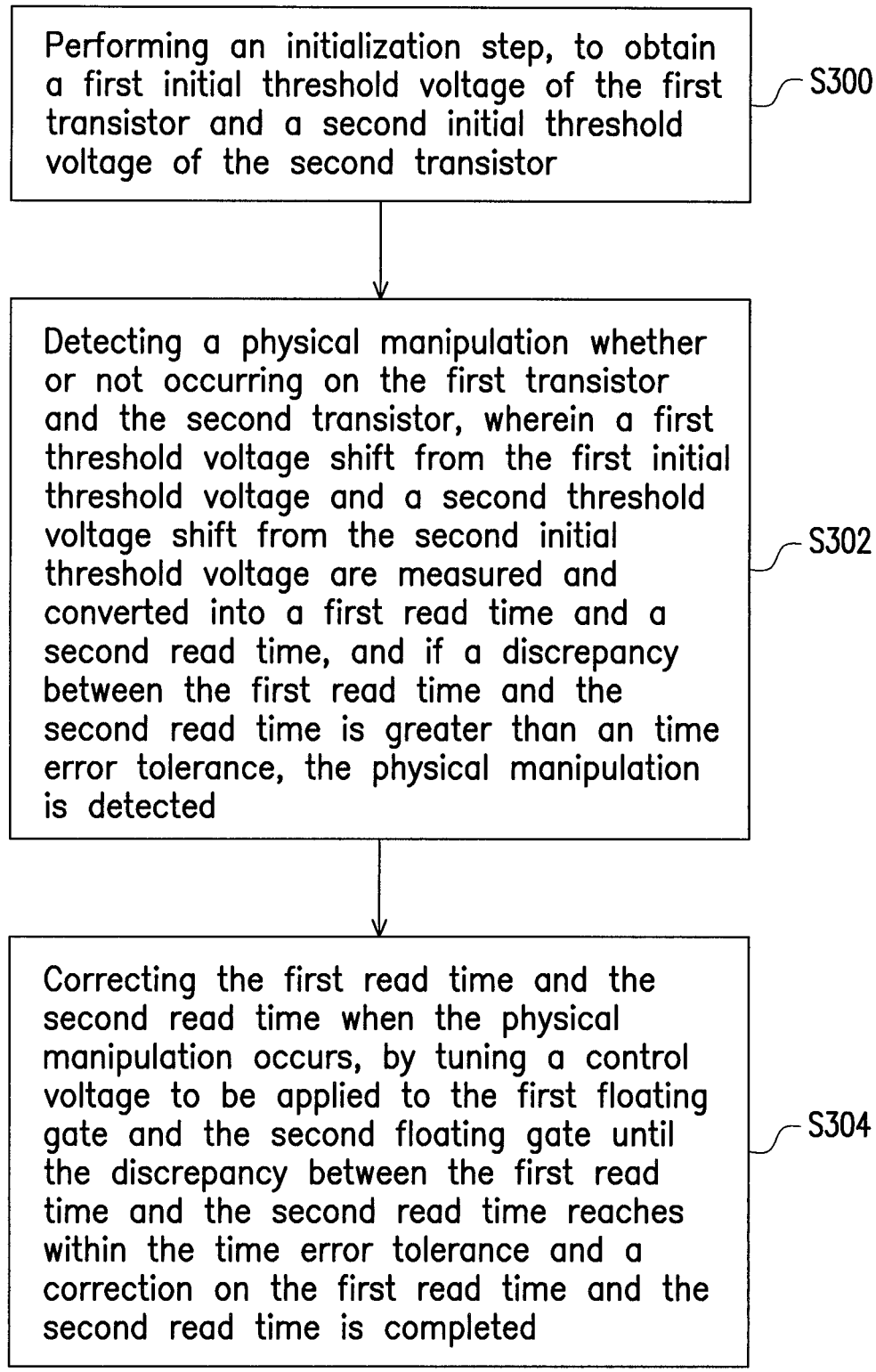
FIG. 29 is a flow chart of manipulation detection-correction method for the semiconductor device with SSAD1 and SSAD2, according to an exemplary embodiment of the invention.

FIG. 29 is a flow chart of the detection-correction method for SSAD1 and SSAD2, according to an exemplary embodiment of the invention. In FIG. 29, the semiconductor device including SSAD1 and SSAD2 as described in the exemplary embodiments of the invention. In step S300, the detection-correction will begin after the initialization step for obtaining initial threshold voltages of the SSAD1 and SSAD2. S302 will detect whether or not a physical manipulation is made, wherein first and second threshold voltage shifts are measured from the first and second initial thresholds, and converted to first and second read times, respectively, and if a discrepancy between the first read time and the second read time is greater than an time error tolerance, it is regarded that the physical manipulation is detected. In step S304, the method also includes correcting the first read time and the second read time when the physical manipulation is made, by tuning a control voltage to be applied to the common word line. The correction will be iterated until the discrepancy between the first read time and the second read time reaches within the time error tolerance.

Figure 30:
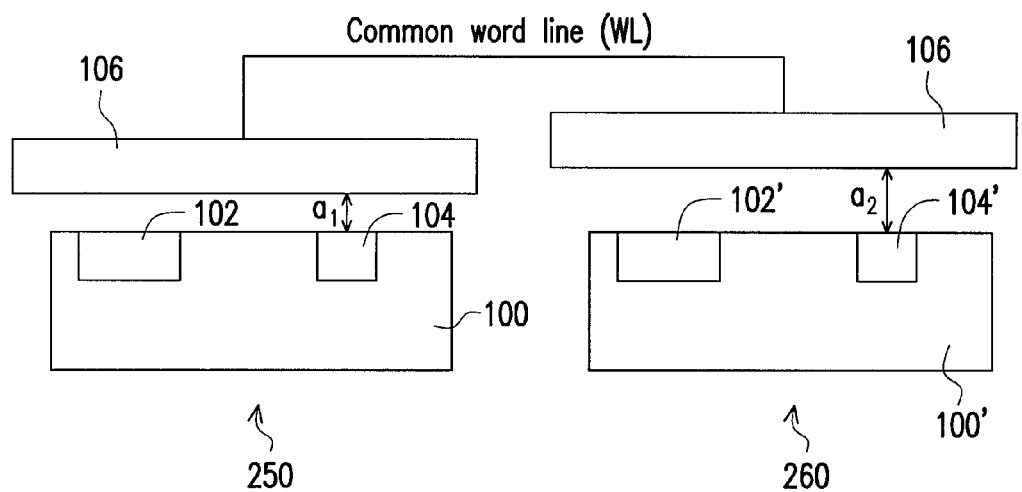
FIG. 30 is a cross-sectional view, schematically illustrating a device structure, according to an exemplary embodiment of the invention.

The embodiments of the invention have provided the correcting mechanism to correct the read time manipulated by physical manipulation. The SSAD structure in FIGS. 11 and 12 can be further modified. FIG. 30 is a cross-sectional view, schematically illustrating a SSAD structure, according to an exemplary embodiment of the invention. As mentioned in FIG. 6 and FIG. 7, the isolation 112 can be in various structures, wherein STI and LOCOS are exemplary isolations. However, if is the separation distance between the source diffusion regions 102, 102' and the control gate 104, 104' as a diffusion region is sufficiently large, such as 10 microns, the isolation effect can be achieved, and there is no need of the additional isolation like STI or LOCOS. The long width surface on the substrate 100 can serve as the isolation effect.

Figure 31:
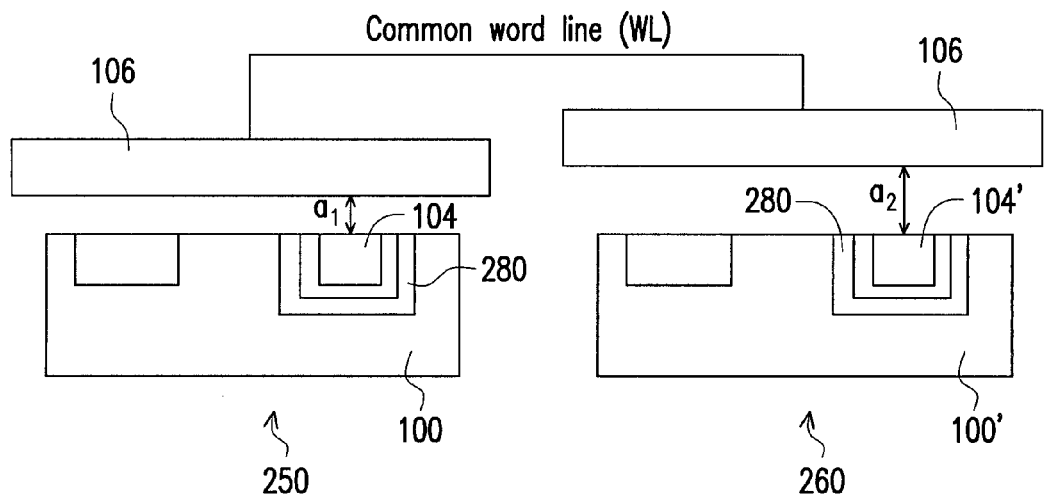
FIG. 31 is a cross-sectional view, schematically illustrating a device structure, according to an exemplary embodiment of the invention.

FIG. 31 is a cross-sectional view, schematically illustrating a SSAD structure, according to an exemplary embodiment of the invention. In FIG. 31, it is another example of isolation. PN-junction or NP-junction 280 surrounding the control gate CG, 108, 108' may also be taken to isolate the source diffusion regions 102, 102' from the control gates 108, 108'. Any proper isolation can be applied without specific limitation.

Figure 32:
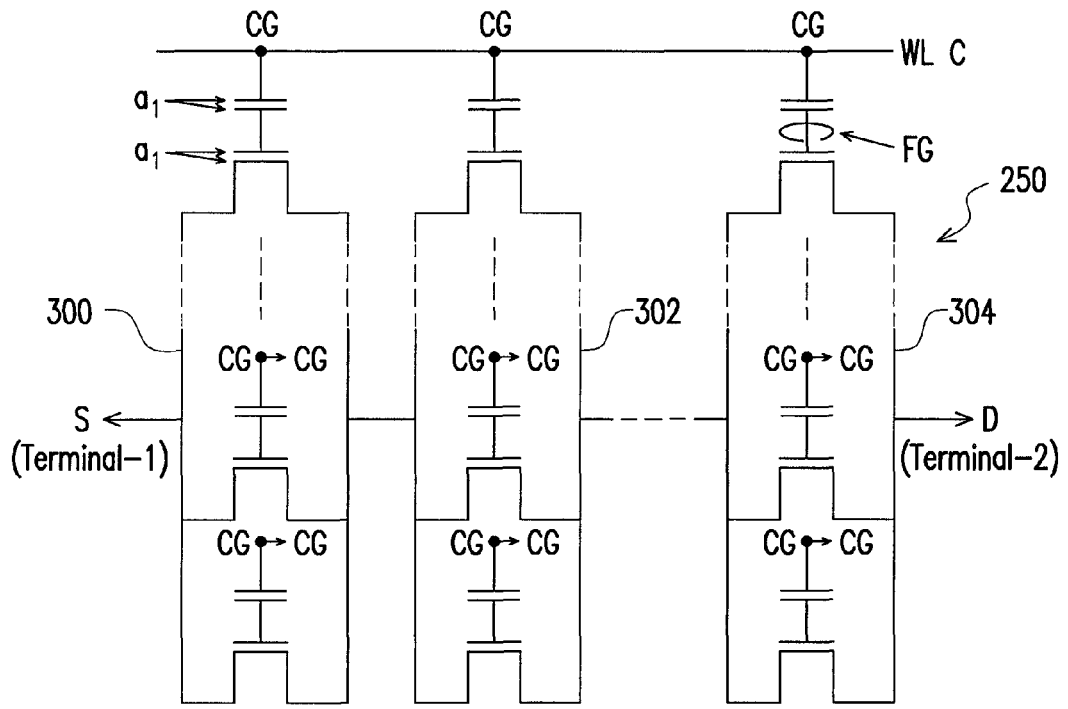
FIG. 32 is a circuit drawing, schematically illustrating an equivalent circuit composed of SSAD1, according to an exemplary embodiment of the invention.
Figure 33:
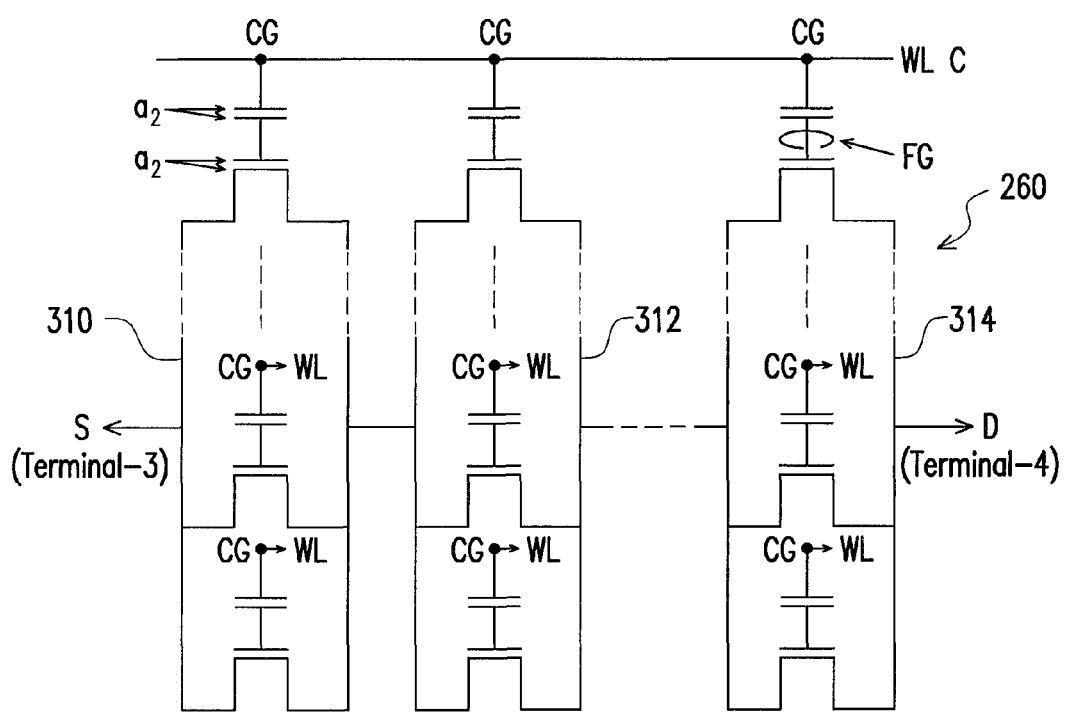
FIG. 33 is a circuit drawing, schematically illustrating an equivalent circuit composed of SSAD2, according to an exemplary embodiment of the invention.

FIG. 32 is a circuit drawing, schematically illustrating the SSAD1, according to an exemplary embodiment of the invention. In FIG. 32, based on the structure in FIG. 12, multiple transistors 250 are electronically connected in parallel to be several parallel circuit parts 300, 302, and 304. However, the parallel circuit parts 300, 302, and 304 are electrically connected in series between the terminal-1 and the terminal-2, as the group of transistors of SSAD1. The terminal-1 is electrically connected to the source region (S), and the terminal-2 is electrically connected to the drain region (D). FIG. 33 is a circuit drawing, schematically illustrating the SSAD2, according to an exemplary embodiment of the invention. Likewise, in FIG. 33, multiple transistors 260 are electronically connected in parallel to be several parallel circuit parts 310, 312, and 314. However, the parallel circuit parts 310, 312, and 314 are electrically connected in series between the terminal-3 and the terminal-4, as the group of transistors of SSAD2. The terminal-3 is electrically connected to the source region (S), and the terminal-4 is electrically connected to the drain region (D).

Figure 34:
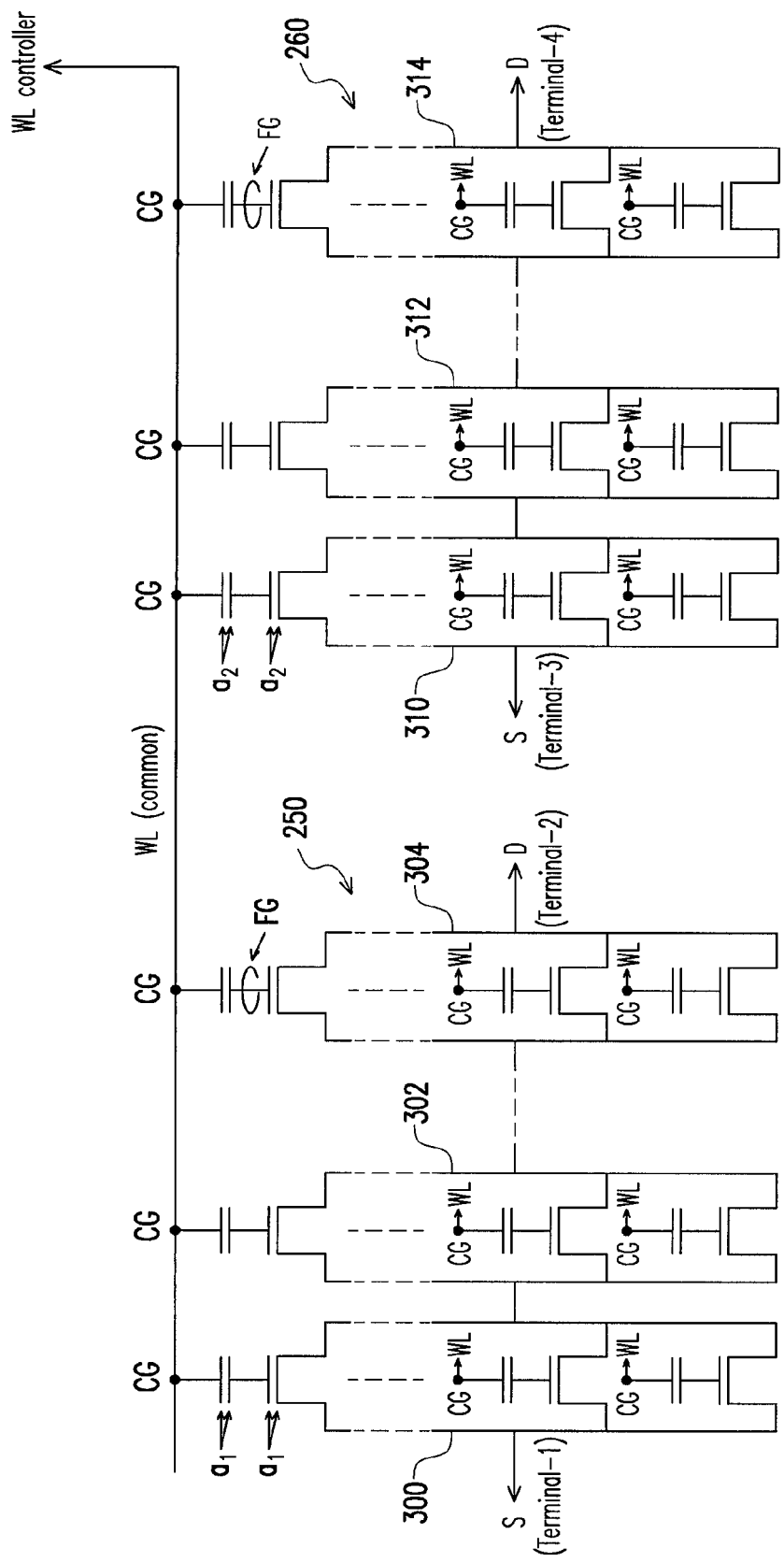
FIG. 34 is a circuit drawing, schematically illustrating a circuit composed of SSAD1 and SSAD2, according to an exemplary embodiment of the invention.

FIG. 34 is a circuit drawing, schematically illustrating an IBLET composed of SSAD1 and SSAD2, according to an exemplary embodiment of the invention. In further expansion of the IBLET structure, the SSAD1 in FIG. 32 and the SSAD2 in FIG. 33 are electronically connected by the common word line (WL), which is provided by the WL controller. The full IBLET structure includes two groups of SSAD transistors with different thicknesses of the dielectric layer.

Figure 35:
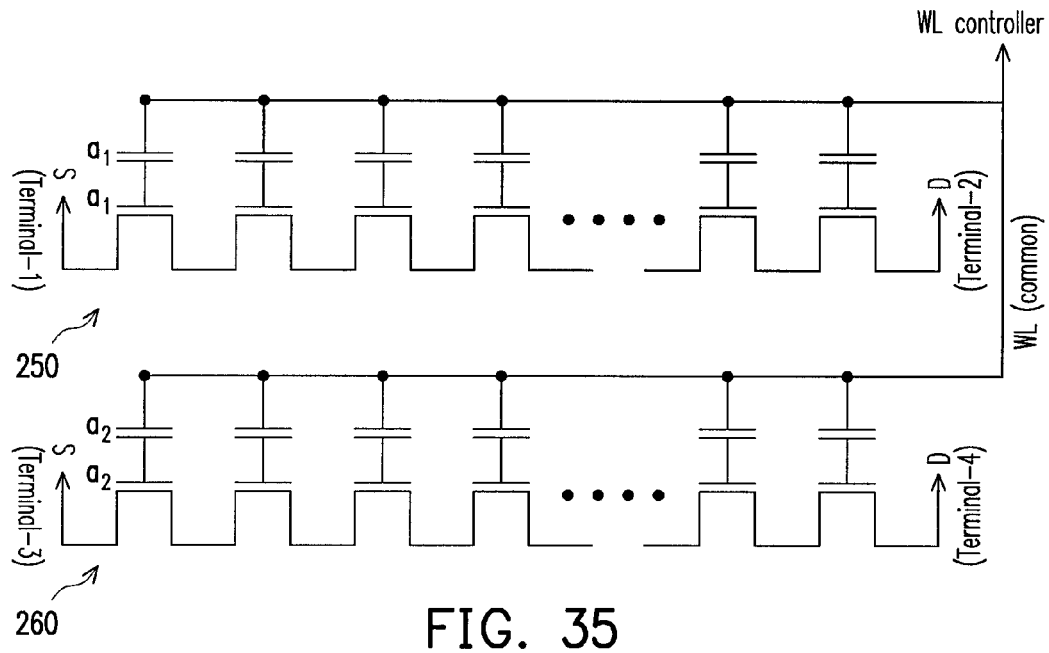
FIG. 35 is a circuit drawing, schematically illustrating a circuit composed of SSAD1 and SSAD2, according to an exemplary embodiment of the invention.

FIG. 35 is a circuit drawing, schematically illustrating another IBLET composed of SSAD1 and SSAD2, according to an exemplary embodiment of the invention. Alternatively, in FIG. 35, the transistors 250 are electronically connected in series between the terminal-1 and the terminal-2 as the group SSAD1. Likewise, the transistors 260 are electronically connected in series between the terminal-3 and the terminal-4 as the group SSAD2. All the control gates are electronically connected to the WL controller by the common WL.

Figure 36:
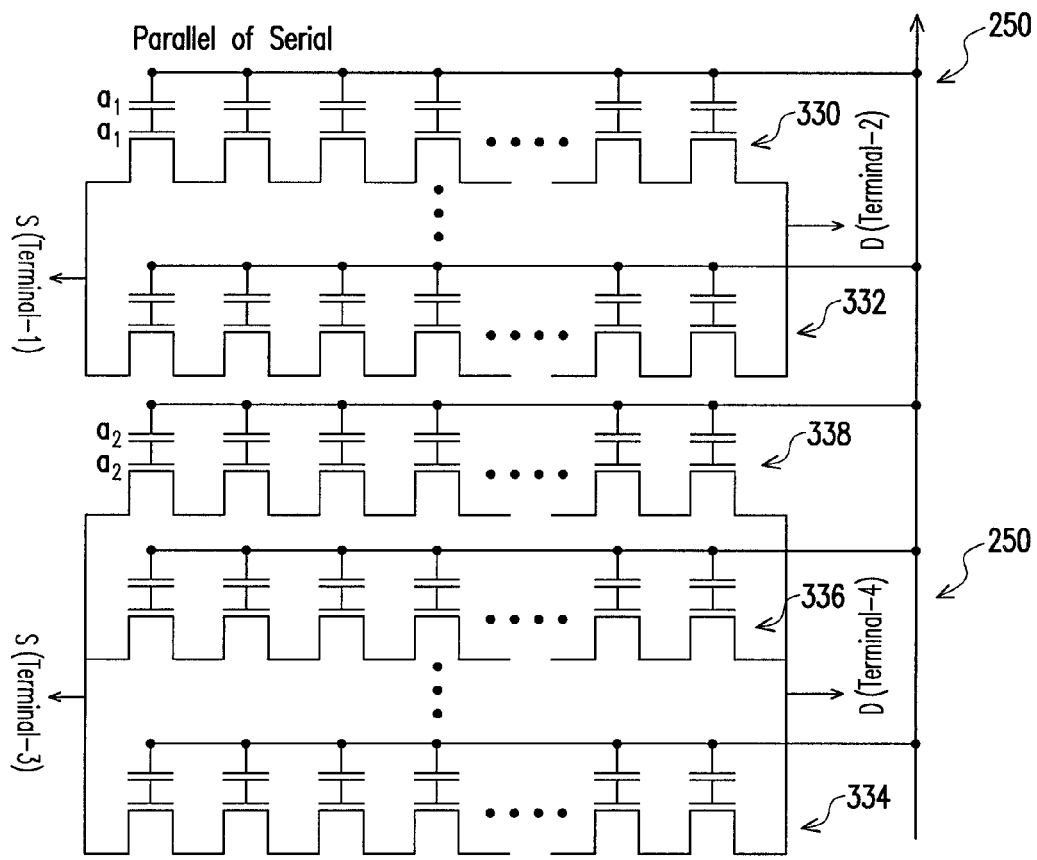
FIG. 36 is a circuit drawing, schematically illustrating a circuit composed of SSAD1 and SSAD2, according to an exemplary embodiment of the invention.

FIG. 36 is a circuit drawing, schematically illustrating another IBLET composed of SSAD1 and SSAD2, according to an exemplary embodiment of the invention. In FIG. 36, even further, a mixed circuit is composed of parallel and series-electronical connections. For the group of SSAD1, the transistors in each of the circuit part 330 and the circuit part 332 are electronically connected in series between the terminal-1 and the terminal-2. Additionally, the circuit part 330 and the circuit part 332 are electrically connected in parallel. For the group of SSAD2, the transistors in each of the circuit parts 334, 336, 338 are electrically connected in series between the terminal-3 and the terminal-4. Additionally, the circuit parts 334, 336, 338 are electrically connected in parallel each other. It should be noted that the number of serial chain of SSAD1 (330 and/or 332) and that of serial-chain of SSAD2 (334, 336 and.or 338) are not limited.

In other words, the layout of the timing cells of the SSAD 1 and SSAD2 can be changed according to the actual design. The embodiments in FIGS. 30-36 are the examples.

Further in considering the chip level for the IBLET, a chip may include the IBLET unit, the functional blocks, and the manipulation detection unit and manipulation correction unit, which may be integrated together as a single unit or stand separate units.

Figure 37:
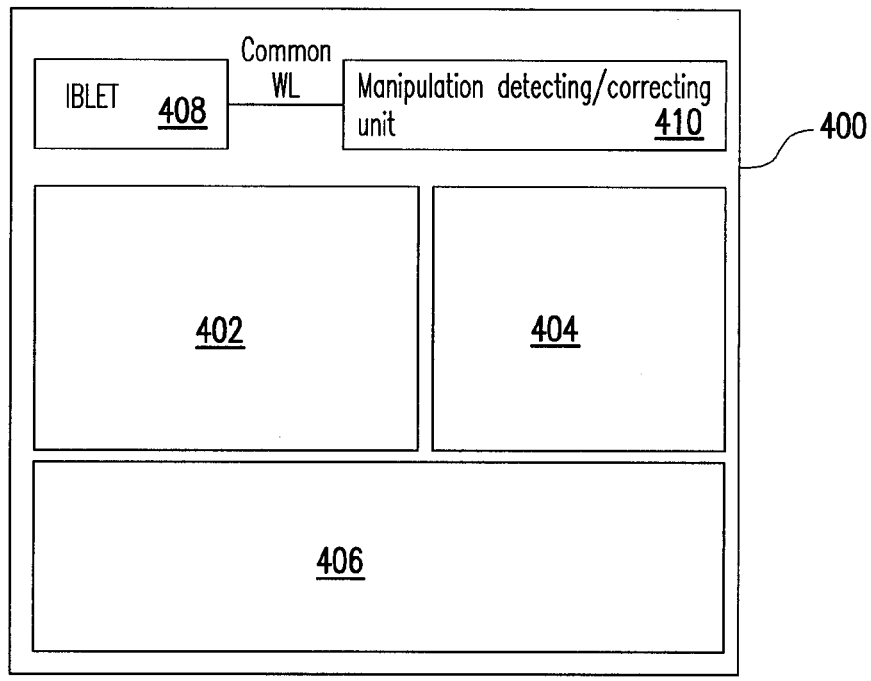
FIG. 37 is a drawing, schematically illustrating a chip layout with the batteryless electron timer (IBLET), according to an exemplary embodiment of the invention.

FIG. 37 is a drawing, schematically illustrating a chip structure with the integrated batteryless electron timer (IBLET), according to an exemplary embodiment of the invention. In FIG. 37, the embodiment is a single chip 400, in which the IBLET unit 408, the manipulation detecting/correcting unit 410, and several functional blocks 402, 404, 406 are integrated. The IB LET unit 408 has the time cells arranged in the groups SSAD1 and SSAD2 as previously described. If a physical manipulation is detected in the detection unit, then the correction unit works to correct the time elapse. The manipulation detecting/correcting unit 410 includes the manipulation detecting function and the manipulation correcting function, which are integrated as a single circuit unit in this example.

Figure 38:
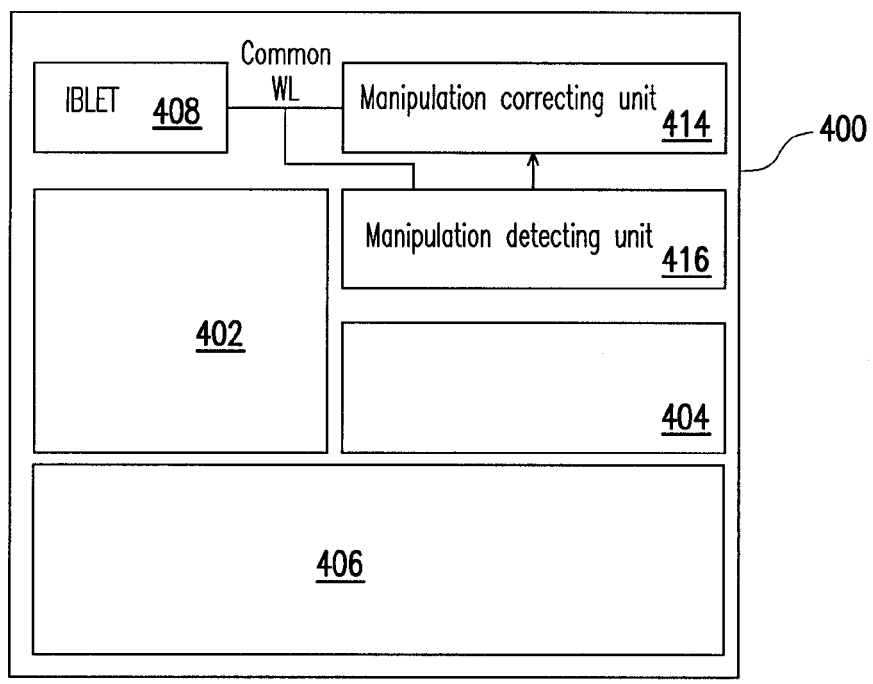
FIG. 38 is a drawing, schematically illustrating a chip layout with the IBLET unit, according to an exemplary embodiment of the invention.

FIG. 38 is a drawing, schematically illustrating a chip structure with the IBLET unit, according to an exemplary embodiment of the invention. In FIG. 38, the chip 400 is similar to the chip 400 in FIG. 37 but the manipulation detecting/correcting unit 410 in FIG. 37 is separated into two units as the manipulation correction unit 414 and the manipulation detecting unit 416. The manipulation detecting unit 416 is electrically connected to the common word line (WL) However, the manipulation correction unit 414 needs to electronically connect to the IBLET unit 408 to apply the gate voltage from the common WL.

Figure 39:
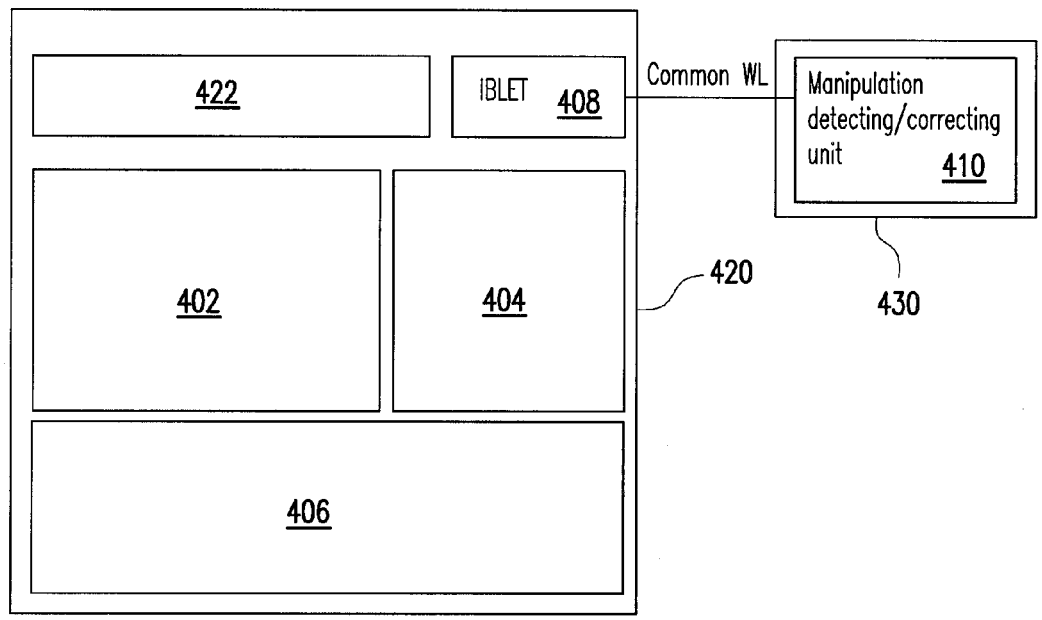
FIG. 39 is a drawing, schematically illustrating a chip layout with the IBLET unit, according to an exemplary embodiment of the invention.

FIG. 39 is a drawing, schematically illustrating a chip structure with the IBLET unit 408, according to an exemplary embodiment of the invention. In FIG. 39, two chips 420, 430 are used to implement the circuit. The manipulation detecting/correcting unit 410 is embedded in another chip 430 external to the chip 420. The chip 420 includes the functional blocks 402, 404, 406, and 422, and the IBLET 408.

Figure 40:
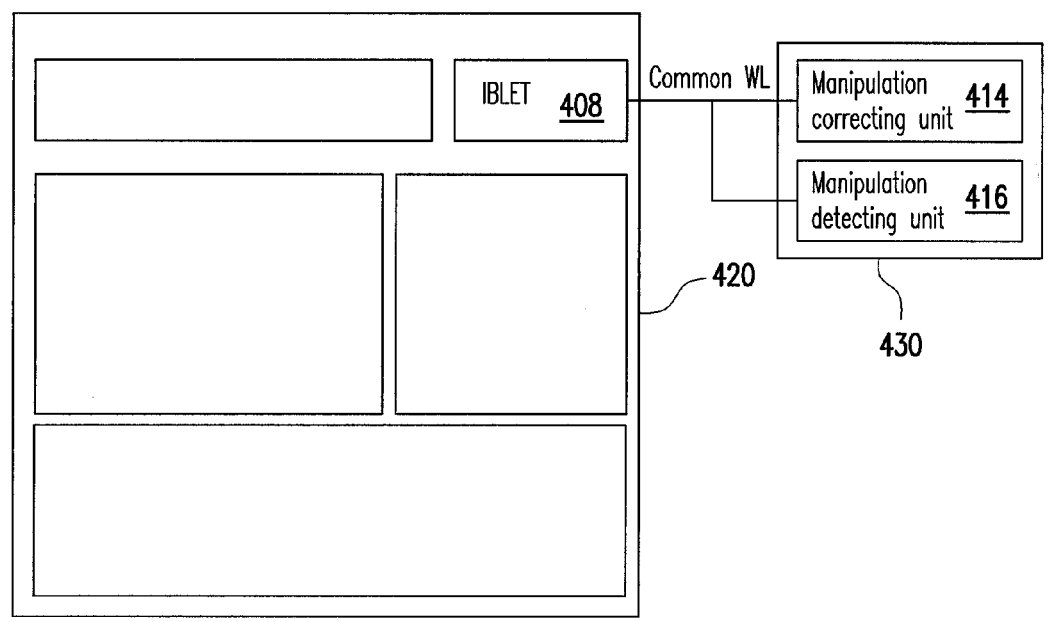
FIG. 40 is a drawing, schematically illustrating a chip layout with the IBLET unit, according to an exemplary embodiment of the invention.

FIG. 40 is a drawing, schematically illustrating a chip structure with the IBLET unit, according to an exemplary embodiment of the invention. In FIG. 40, two chips 420, 430 are used to implement the circuit, similar to FIG. 39. However, the chip 430 separately includes the manipulation correction unit 414 and the manipulation detecting unit 416. The manipulation correction unit 414 and the manipulation detection unit 416 are electrically connected to the IBLET 408 via the common.

Several embodiments have been provided for describing the invention. However, the invention is not just limited to the embodiments. The previously described exemplary embodiments of the present invention have the advantages aforementioned, wherein the advantages aforementioned not required in all versions of the invention.

It will be apparent to those skilled in the art that various modifications and variations can be made to the disclosed embodiments. It is intended that the specification and examples are considered as exemplary only, with a true scope of the disclosure being indicated by the following claims and their equivalents.

What is claimed is:

1. A semiconductor device, comprising:
a first semiconductor substrate;
a first dielectric layer with a first thickness, formed on a first surface of the first semiconductor substrate;
a first floating gate, formed on the first dielectric layer;
a first source diffusion region and a first drain diffusion region, respectively formed at two sides of the first floating gate on the first surface of the first semiconductor substrate;
a first control gate diffusion region, formed separately from the first source diffusion region and the first drain diffusion region, on a surface of the first semiconductor substrate, wherein the first source diffusion region, the first drain diffusion region, the first floating gate, and the first control gate diffusion region form as a part of a first transistor;
a second semiconductor substrate;
a second dielectric layer with a second thickness, formed on a second surface of the second semiconductor substrate, wherein the second thickness is larger than the first thickness of the first dielectric layer;
a second floating gate, formed on the second dielectric layer;
a second source diffusion region and a second drain diffusion region, respectively formed at two sides of the second floating gate on the second surface of the second semiconductor substrate;
a second control gate diffusion region, formed separately from the second source diffusion region and the second drain diffusion region, on a surface of the second semiconductor substrate, wherein the second source diffusion region, the second drain diffusion region, the second floating gate, and the second control gate diffusion region form as a part of a second transistor; and
a common word line, electrically connected to the first control gate diffusion region and the second control gate diffusion region.

2. The semiconductor device of claim 1, wherein a plurality of the first transistors form a first solid-state aging devices (SSAD) unit, and a plurality of the second transistors form a second SSAD unit.

3. The semiconductor device of claim 2, wherein the first transistors of the first SSAD unit are electronically connected in series, parallel, or mix of series and parallel, and the second transistors of the second SSAD unit are electronically connected in series, parallel, or mix of series and parallel.

4. The semiconductor device of claim 1, wherein the first semiconductor substrate and the second semiconductor substrate are a common substrate or separated two substrates.

5. The semiconductor device of claim 1, wherein the first dielectric layer is also between the first control gate diffusion region and the first floating gate, and the second dielectric layer is also between the second control gate diffusion region and the second floating gate.

6. A semiconductor device, comprising:
a first solid-state aging devices (SSAD) unit, comprising at least one first transistor, wherein the first transistor comprises:
a first source diffusion region and a first drain diffusion region in a first substrate;
a first floating gate above the first substrate; and
a first control gate on a surface of the first substrate, separated from the first source diffusion region and the first drain diffusion region, wherein a first dielectric layer with a first thickness is between the first substrate and the first floating gate;
a second SSAD unit, comprising at least one second transistor, wherein the second transistor comprises:
a second source diffusion region and a second drain diffusion region in a second substrate;
a second floating gate above the second substrate; and
a second control gate on a surface of the second substrate separated from the second source diffusion region and the second drain diffusion region, wherein a second dielectric layer with a second thickness is between the second substrate and the second floating gate and the second thickness is larger than the first thickness; and
a common word line, electrically connected to the first control gate and the second control gate.

7. The semiconductor device of claim 6, wherein a first SSAD unit comprises a plurality of the first transistors, and a second SSAD unit comprises a plurality of the second transistors.

8. The semiconductor device of claim 7, wherein the first transistors of the first SSAD unit are electronically connected in series, parallel, or mix of series and parallel, and the second transistors of the second SSAD unit are electronically connected in series, parallel, or mix of series and parallel.

9. The semiconductor device of claim 6, wherein the first substrate and the second substrate are a common substrate or separated two substrates.

10. The semiconductor device of claim 6, wherein the first dielectric layer is also between the first control gate and the first floating gate, and the second dielectric layer is also between the second control gate and the second floating gate.

11. The semiconductor device of claim 6, wherein the first SSAD unit and the second SSAD unit form as a part of an integrated battery-less electronic timer (IBLET) unit, wherein the semiconductor device further comprises:
a manipulation detecting circuit unit, electrically connected to the IBLET unit to detect whether or not a physical manipulation is made, wherein a first threshold voltage shift from a first initial threshold voltage and a second threshold voltage shift from a second initial threshold voltage are measured and converted into a first read time and a second read time, and if a discrepancy between the first read time and the second read time is greater than an time error tolerance, the physical manipulation is regarded as detected; and
a manipulation correcting circuit unit, electrically connected to the IBLET unit to correct the first read time and the second read time when the physical manipulation is detected, by tuning a control voltage to be repeatedly applied to the common word line until a discrepancy between the first read time and the second read time becomes smaller than the time error tolerance.

12. The semiconductor device of claim 11, wherein the manipulation detecting circuit unit and the manipulation correcting circuit unit are integrated as an external chip outside a circuit chip having the IBLET unit and are electrically connected to the common word line of the IBLET unit.

13. The semiconductor device of claim 11, wherein the manipulation detecting circuit unit and the manipulation correcting circuit unit are integrated as an external circuit unit in a circuit chip having the IBLET unit and is electrically connected to the IBLET unit via the common word line.

14. The semiconductor device of claim 11, wherein the manipulation detecting circuit unit and the manipulation correcting circuit unit are separately electrically connected to the IBLET unit.

15. A manipulation detection-correction method on the semiconductor device of claim 6, the manipulation detection-correction method comprising
performing an initialization step, to obtain a first initial threshold voltage of the first transistor and a second initial threshold voltage of the second transistor;
detecting whether or not a physical manipulation is made, wherein a first threshold voltage shift from the first initial threshold voltage and a second threshold voltage shift from the second initial threshold voltage are measured and converted into a first read time and a second read time, and if a discrepancy between the first read time and the second read time is greater than an time error tolerance, the physical manipulation is regarded as detected; and
correcting the first read time and the second read time when the physical manipulation is detected, by tuning a control voltage to be repeatedly applied to a common word line electrically connected to control gates of the first SSAD unit and the second SSAD unit until a discrepancy between the first read time and the second read time becomes smaller than the time error tolerance.

16. The manipulation detection-correction method of claim 15, wherein the initialization step comprises:
applying a predetermined control gate voltage to the common word line;
iterating a programming process and an erasing process on the first floating gate and the second floating gate;
reading a first threshold voltage of the first transistor and a second threshold voltage of the second transistor; and
memorizing the first threshold voltage and the second threshold voltage as the first initial threshold voltage and the second initial threshold voltage, respectively.

17. The manipulation detection-correction method of claim 15, wherein the step of detecting the physical manipulation comprises:
applying a predetermined control gate voltage to the common word line;
measuring the first threshold voltage and the second threshold voltage;
obtaining the first threshold voltage shift and the second threshold voltage shift by comparing the first threshold voltage and the second threshold voltage with the first initial threshold voltage and the second initial threshold voltage, respectively;
obtaining the first read time and the second read time according to a pre-measured characteristics of threshold voltage and elapse of time;
comparing the discrepancy between the first read time and the second read time with the time error tolerance;
ending the step of detecting the physical manipulation if the discrepancy is smaller than the time error tolerance; and
indicating a detection of the physical manipulation if the discrepancy is not smaller than the time error tolerance.

18. The manipulation detection-correction method of claim 15, wherein when tuning the control voltage in the step of correcting the first read time and the second read time, the control voltage represented by $V_{CG_{crr}}$ is tuned based on a relation:

$$V_{CG_{crr}} = k \frac{t_1 - t_2}{\varepsilon_{crr}} \frac{a_1 a_2}{a_2 - a_1},$$

where k is a constant, $t_1$ is the first read time, $t_2$ is the second read time, $a_1$ is a first thickness of the first dielectric layer, $a_2$ is a second thickness of the second dielectric layer, $\varepsilon_{crr}$ is a predetermined correction time during correction.

19. The manipulation detection-correction method of claim 15, wherein the step of correcting the first read time and the second read time comprise:
applying the tuned control voltage to the common word line;
measuring the first threshold voltage and the second threshold voltage;
obtaining the first threshold voltage shift and the second threshold voltage shift by comparing the first threshold voltage and the second threshold voltage with the first initial threshold voltage and the second initial threshold voltage, respectively;
obtaining the first read time and the second read time according to a pre-measured characteristics of threshold voltage and elapse of time,
comparing a discrepancy between the first read time and the second read time with the time tolerance error; and
iterating the foregoing steps from the step of applying the tuned control voltage if the discrepancy is not smaller than the time error tolerance until a discrepancy becomes smaller than the time error tolerance.

* * * * *